US012646900B2

(12) United States Patent
Miyamoto

(10) Patent No.: US 12,646,900 B2
(45) Date of Patent: Jun. 2, 2026

(54) LASER APPARATUS, PULSE WIDTH STRETCHING APPARATUS, AND ELECTRONIC DEVICE MANUFACTURING METHOD

(71) Applicant: Gigaphoton Inc., Tochigi (JP)

(72) Inventor: Hirotaka Miyamoto, Oyama (JP)

(73) Assignee: Gigaphoton Inc., Tochigi (JP)

( * ) Notice: Subject to any disclaimer, the term of this patent is extended or adjusted under 35 U.S.C. 154(b) by 898 days.

(21) Appl. No.: 17/938,246

(22) Filed: Oct. 5, 2022

(65) Prior Publication Data

US 2023/0022170 A1 Jan. 26, 2023

Related U.S. Application Data

(63) Continuation of application No. PCT/JP2020/020890, filed on May 27, 2020.

(51) Int. Cl.
*H01S 3/00* (2006.01)
*G03F 7/20* (2006.01)
(Continued)

(52) U.S. Cl.
CPC .............. *H01S 3/0057* (2013.01); *G03F 7/20* (2013.01); *H01S 3/225* (2013.01); *H01S 3/2308* (2013.01)

(58) Field of Classification Search
CPC ...... H01S 3/0057; H01S 3/225; H01S 3/2308; G03F 7/20
See application file for complete search history.

(56) References Cited

U.S. PATENT DOCUMENTS 5,309,456 A 5/1994 Horton
6,238,063 B1 5/2001 Tanitsu et al.
(Continued)

FOREIGN PATENT DOCUMENTS

CN 1472777 A 2/2004
CN 108352673 A 7/2018
(Continued)

OTHER PUBLICATIONS

An Office Action mailed by China National Intellectual Property Administration on Jul. 8, 2025, which corresponds to Chinese Patent Application No. 202080099484.3 and is related to U.S. Appl. No. 17/938,246; with English language translation.
(Continued)

*Primary Examiner* — Michael Carter
(74) *Attorney, Agent, or Firm* — Studebaker Brackett PLLC

(57) ABSTRACT

A laser apparatus according to an aspect of the present disclosure includes a laser oscillator configured to emit a pulse laser beam, and a first optical pulse stretcher, a second optical pulse stretcher, and a third optical pulse stretcher that are disposed on an optical path of the pulse laser beam. When L1 represents an optical path length of a delay optical path of the first optical pulse stretcher, L2 represents an optical path length of a delay optical path of the second optical pulse stretcher, L3 represents an optical path length of a delay optical path of the third optical pulse stretcher, and n represents an integer equal to or larger than two, L2 is an integral multiple of L1 by an integer equal to or larger than two and L3 satisfies the following condition: $(n-0.75)\times L1 \le L3 \le (n-0.25)\times L1$.

11 Claims, 14 Drawing Sheets

(51) Int. Cl.
    *H01S 3/225*     (2006.01)
    *H01S 3/23*     (2006.01)

(56)         References Cited

U.S. PATENT DOCUMENTS

| | | |
|---|---|---|
| 2003/0234854 A1 | 12/2003 | Hattori |
| 2006/0216037 A1 | 9/2006 | Wiessner et al. |
| 2008/0240171 A1 | 10/2008 | Spinelli et al. |
| 2009/0067468 A1 | 3/2009 | Brown et al. |
| 2009/0232171 A1 | 9/2009 | Abe et al. |
| 2015/0188274 A1* | 7/2015 | Wakabayashi ........ H01S 3/2256 |
| | | 372/25 |
| 2018/0254600 A1 | 9/2018 | Kumazaki et al. |
| 2019/0103724 A1* | 4/2019 | Onose ................. G03F 7/70025 |
| 2019/0157120 A1* | 5/2019 | Tanaka ............... H10D 86/0229 |

FOREIGN PATENT DOCUMENTS

| | | |
|---|---|---|
| CN | 109314365 A | 2/2019 |
| CN | 109564857 A | 4/2019 |
| JP | 2002-134814 A | 5/2002 |
| JP | 2006-186046 A | 7/2006 |
| JP | 2009-514246 A | 4/2009 |
| JP | 2009-246345 A | 10/2009 |
| WO | 2014/003018 A1 | 1/2014 |
| WO | 2018/020564 A1 | 2/2018 |
| WO | 2018/047220 A1 | 3/2018 |
| WO | 2020/036736 A1 | 2/2020 |

OTHER PUBLICATIONS

International Search Report issued in PCT/JP2020/020890; mailed Aug. 4, 2020.
International Preliminary Report on Patentability (Chapter I) and Written Opinion of the International Searching Authority issued in PCT/JP2020/020890; issued Nov. 17, 2022.
An Office Action issued by the Japanese Patent Office on Dec. 27, 2023, which corresponds to Japanese Patent Application No. 2022-527353 and is related to U.S. Appl. No. 17/938,246.
An Office Action mailed by China National Intellectual Property Administration on Mar. 13, 2025, which corresponds to Chinese Patent Application No. 202080099484.3 and is related to U.S. Appl. No. 17/938,246; with English language translation.

\* cited by examiner

Count: 307200            Min: 830.245
Mean: 1182.384         Max: 1638.780
StdDev: 95.670          Mode: 1182.400(4108)
Bins: 256                 Bin Width: 3.158

| | L1 [m] | L2 [m] | L3 [m] | L2+L3 [m] | TIS [ns] | TIS/(L2+L3) |
|---|---|---|---|---|---|---|
| COMPARATIVE EXAMPLE 1 | 7 | 14 | 35 | 49 | 298.1 | 6.08 |
| EXAMPLE A | 7 | 14 | 33.25 (−0.25L1) | 47.25 | 308.3 | 6.52 |
| EXAMPLE B | 7 | 14 | 32.55 (−0.35L1) | 46.55 | 313.5 | 6.73 |
| EXAMPLE C | 7 | 14 | 31.5 (−0.5L1) | 45.5 | 313.1 | 6.88 |
| EXAMPLE D | 7 | 14 | 30.45 (−0.65L1) | 44.45 | 307 | 6.91 |
| EXAMPLE E | 7 | 14 | 29.75 (−0.75L1) | 43.75 | 293.8 | 6.72 |

Fig. 13

| | L1 [m] | L2 [m] | L3 [m] | L4 [m] | L3+L4 [m] | TIS [ns] | TIS/(L3+L4) |
|---|---|---|---|---|---|---|---|
| COMPARATIVE EXAMPLE 2 | 7 | 14 | 35 | 42 | 77 | 467.3 | 6.07 |
| EXAMPLE F | 7 | 14 | 33.25 (−0.25L1) | 42 | 75.25 | 525.6 | 6.98 |
| EXAMPLE G | 7 | 14 | 32.55 (−0.35L1) | 42 | 74.55 | 546.4 | 7.33 |
| EXAMPLE H | 7 | 14 | 31.5 (−0.5L1) | 42 | 73.5 | 545.1 | 7.42 |
| EXAMPLE I | 7 | 14 | 30.45 (−0.65L1) | 42 | 72.45 | 541.8 | 7.48 |
| EXAMPLE J | 7 | 14 | 29.75 (−0.75L1) | 42 | 71.75 | 517 | 7.21 |
| EXAMPLE K | 7 | 14 | 31.5 (−0.5L1) | 40.25 (−0.25L1) | 71.75 | 529.1 | 7.37 |
| EXAMPLE L | 7 | 14 | 31.5 (−0.5L1) | 43.75 (+0.25L1) | 75.25 | 543.7 | 7.23 |

LASER APPARATUS, PULSE WIDTH STRETCHING APPARATUS, AND ELECTRONIC DEVICE MANUFACTURING METHOD

CROSS-REFERENCE TO RELATED APPLICATIONS

The present application is a continuation application of International Application No. PCT/JP2020/020890, filed on May 27, 2020, the entire contents of which are hereby incorporated by reference.

BACKGROUND

1. Technical Field

The present disclosure relates to a laser apparatus, a pulse width stretching apparatus, and an electronic device manufacturing method.

2. Related Art

Recently, in a semiconductor exposure apparatus, resolving power improvement has been requested along with miniaturization and high integration of a semiconductor integrated circuit. Thus, the wavelength of light discharged from an exposure light source has been shortened. Examples of the gas laser apparatus for exposure include a KrF excimer laser apparatus configured to output an ultraviolet laser beam having a wavelength of 248 nm approximately, and an ArF excimer laser apparatus configured to output an ultraviolet laser beam having a wavelength of 193 nm approximately.

The KrF excimer laser apparatus and the ArF excimer laser apparatus each have a wide spectrum line width of spontaneous oscillation light of 350 pm to 400 pm. Thus, chromatic aberration occurs in some cases when a projection lens is made of a material that transmits ultraviolet light such as KrF and ArF laser beams. This can lead to resolving power decrease. Thus, the spectrum line width of a laser beam output from the gas laser apparatus needs to be narrowed so that chromatic aberration becomes negligible. To narrow the spectrum line width, a line narrowing module (LNM) including a line narrowing element (for example, etalon or grating) is provided in a laser resonator of the gas laser apparatus in some cases. In the following, a gas laser apparatus that achieves narrowing of the spectrum line width is referred to as a line narrowing gas laser apparatus.

LIST OF DOCUMENTS

Patent Documents

Patent Document 1: U.S. Pat. No. 5,309,456
Patent Document 2: U.S. Pat. No. 6,238,063

SUMMARY

A laser apparatus according to an aspect of the present disclosure includes a laser oscillator configured to emit a pulse laser beam, a first optical pulse stretcher disposed on an optical path of the pulse laser beam, a second optical pulse stretcher disposed on the optical path of the pulse laser beam, and a third optical pulse stretcher disposed on the optical path of the pulse laser beam. When L1 represents an optical path length of a delay optical path of the first optical pulse stretcher, L2 represents an optical path length of a delay optical path of the second optical pulse stretcher, L3 represents an optical path length of a delay optical path of the third optical pulse stretcher, and n represents an integer equal to or larger than two, L2 is an integral multiple of L1 by an integer equal to or larger than two and L3 satisfies the following condition: $(n-0.75)\times L1 \leq L3 \leq (n-0.25)\times L1$.

A pulse width stretching apparatus according to another aspect of the present disclosure is a pulse width stretching apparatus that stretches a pulse width of a pulse laser beam and including a first optical pulse stretcher, a second optical pulse stretcher, and a third optical pulse stretcher that are disposed on an optical path of the pulse laser beam. When L1 represents an optical path length of a delay optical path of the first optical pulse stretcher, L2 represents an optical path length of a delay optical path of the second optical pulse stretcher, L3 represents an optical path length of a delay optical path of the third optical pulse stretcher, and n represents an integer equal to or larger than two, L2 is an integral multiple of L1 by an integer equal to or larger than two, and L3 satisfies the following condition: $(n-0.75)\times L1 \leq L3 \leq (n-0.25)\times L1$.

An electronic device manufacturing method according to another aspect of the present disclosure includes generating a laser beam having a pulse width stretched by a laser apparatus, outputting the laser beam to an exposure apparatus or a laser beam irradiation apparatus, and exposing a photosensitive substrate to the laser beam in the exposure apparatus or irradiating an irradiation target object with the laser beam in the laser beam irradiation apparatus to manufacture an electronic device. The laser apparatus includes a laser oscillator configured to emit a pulse laser beam, a first optical pulse stretcher disposed on an optical path of the pulse laser beam, a second optical pulse stretcher disposed on the optical path of the pulse laser beam, and a third optical pulse stretcher disposed on the optical path of the pulse laser beam. When L1 represents an optical path length of a delay optical path of the first optical pulse stretcher, L2 represents an optical path length of a delay optical path of the second optical pulse stretcher, L3 represents an optical path length of a delay optical path of the third optical pulse stretcher, and n represents an integer equal to or larger than two, L2 is an integral multiple of L1 by an integer equal to or larger than two, and L3 satisfies the following condition: $(n-0.75)\times L1 \leq L3 \leq (n-0.25)\times L1$.

BRIEF DESCRIPTION OF THE DRAWINGS

Embodiments of the present disclosure will be described below merely as examples with reference to the accompanying drawings.

FIG. 1 is a diagram for description of a spectrum line width;

FIG. 2 is a diagram for description of the definition of E95;

FIG. 13 is a table indicating a setting example of optical path lengths L1, L2, L3, and L4 of a first OPS, a second OPS, a third OPS, and a fourth OPS, respectively;

DESCRIPTION OF EMBODIMENTS

<Contents>

1. Terms
    1.1 Definition of E95
    1.2 Definition of coherent length
    1.3 Definition of speckle contrast
    1.4 Definition of TIS pulse time width
2. Overview of laser apparatus according to comparative example
    2.1 Configuration
    2.2 Operation
    2.3 Problem
3. Embodiment 1
    3.1 Configuration
    3.2 Operation
    3.3 Effect
    3.4 Other
4. Embodiment 2
    4.1 Configuration
    4.2 Operation
    4.3 Effect
    4.4 Other
5. Variations of laser apparatus
    5.1 Free-run excimer laser apparatus
        5.1.1 Configuration
        5.1.2 Operation
        5.1.3 Effect
    5.2 Excimer laser apparatus including solid-state laser system as master oscillator
        5.2.1 Configuration
        5.2.2 Operation
        5.2.3 Modification
6. Hardware configurations of various control units
7. Electronic device manufacturing method
8. Other Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Terms

1.1 Definition of E95

Figures 1, 2:
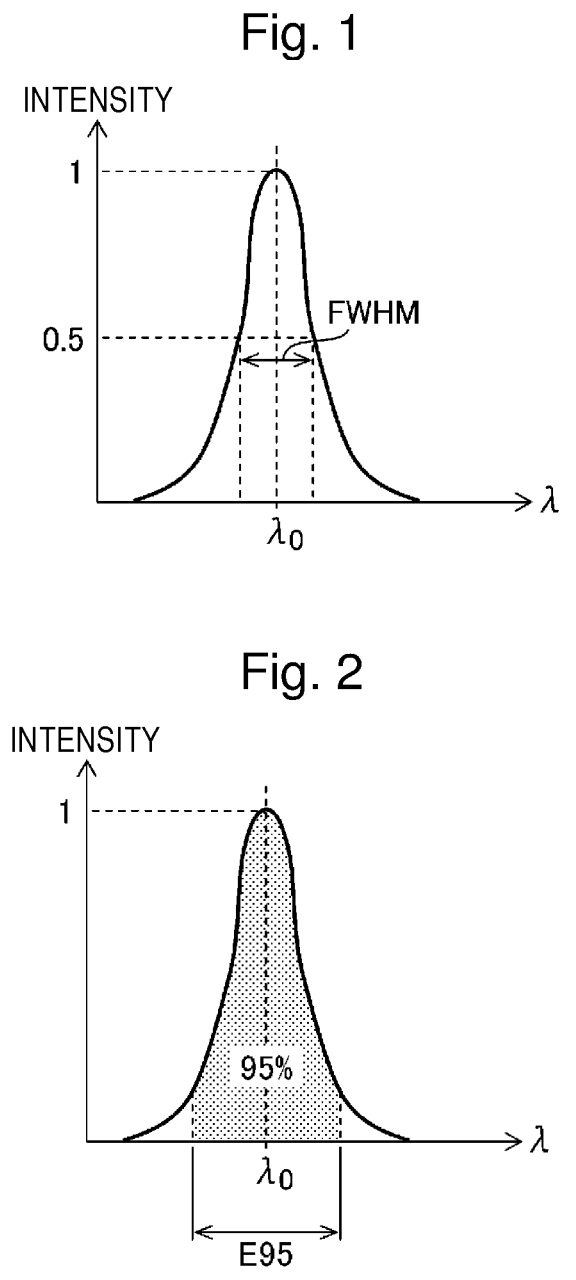

A spectrum line width is the full width of the spectrum waveform of a laser beam as illustrated in FIG. 1 at a light amount threshold value. In the present specification, a relative value of each light amount threshold value with respect to a light amount peak value is referred to as a line width threshold value Thresh (0<Thresh<1). For example, the half value of the peak value is referred to as a line width threshold value 0.5. Note that the full width W/2 of the spectrum waveform at the line width threshold value 0.5 is specially referred to as full width at half maximum (FWHM).

A spectral purity, for example, 95% purity E95 is a full width W95% of a part corresponding to 95% of total spectrum energy centered at a wavelength $\lambda_0$ as illustrated in FIG. 2, and satisfies Expression (1) below.

[Math. 1]

$$\frac{\int_{-\frac{\Delta\lambda}{2}}^{\frac{\Delta\lambda}{2}} g(\lambda + \lambda_0)d\lambda}{\int_{-\infty}^{\infty} g(\lambda + \lambda_0)d\lambda} = 0.95 \tag{1}$$

Note that, in the following description, the spectral purity is E95 unless otherwise stated in the present specification.

1.2 Definition of Coherent Length

A coherent length of a laser beam can be expressed by Expression (2) below.

[Math. 2]

$$\text{Coherent length} = \frac{\lambda_0^2}{\Delta\lambda} \tag{2}$$

where $\lambda_0$ represents the central wavelength of the laser beam and $\Delta\lambda$ represents the spectrum line width.

1.3 Definition of Speckle Contrast

Figure 3:
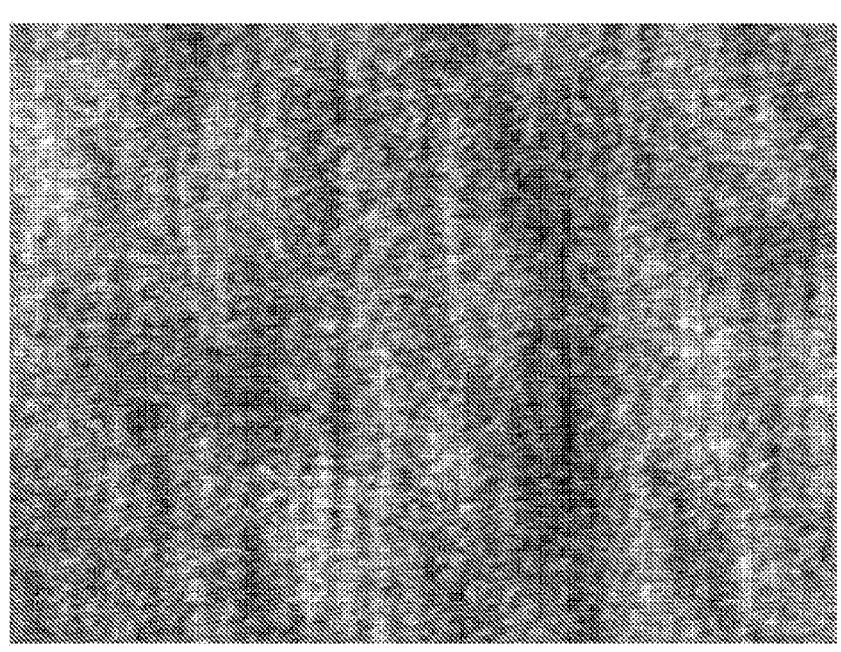
FIG. 3 is a diagram illustrating an example of a speckle image obtained by capturing pattern of grayscale speckles.
Figure 4:
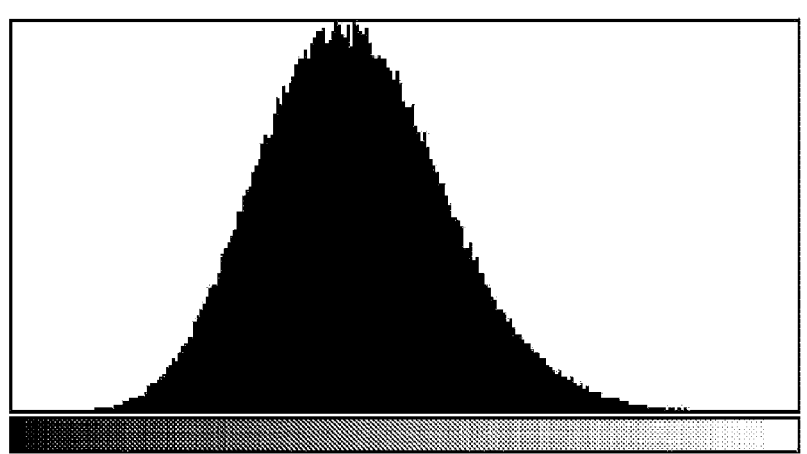
FIG. 4 is a diagram illustrating a grayscale histogram of the speckle image illustrated in FIG. 3.

A speckle is a grayscale speckle generated when a laser beam scatters at a random medium. FIG. 3 is a diagram illustrating an example of a speckle image obtained by capturing pattern of grayscale speckles. FIG. 4 is a diagram illustrating a grayscale histogram of the speckle image illustrated in FIG. 3.

A speckle contrast SC is typically used as a speckle evaluation indicator. The speckle contrast SC can be expressed by Expression (3) below.

[Math. 3]

$$SC = \frac{\sigma}{\bar{I}} \quad (3)$$

where $\sigma$ represents the standard deviation of the intensity of a speckle image and I macron (I with a macron denoted thereon) represents the average of the intensity of the speckle image.

Coherence decreases and the speckle contrast SC decreases as the pulse width of a pulse laser beam increases.

1.4 Definition of TIS Pulse Time Width

A TIS pulse time width is used as an indicator of the pulse time width of a laser beam.

The TIS pulse time width $\Delta T_{TTS}$ is defined by Expression (4) below.

[Math. 4]

$$\Delta T_{TIS} = \frac{\left[\int I(t)dt\right]^2}{\int I(t)^2 dt} \quad (4)$$

In the expression, t represents time, and I(t) represents light intensity at time t. In the present specification, "TIS width" means the TIS pulse time width.

Figure 5:
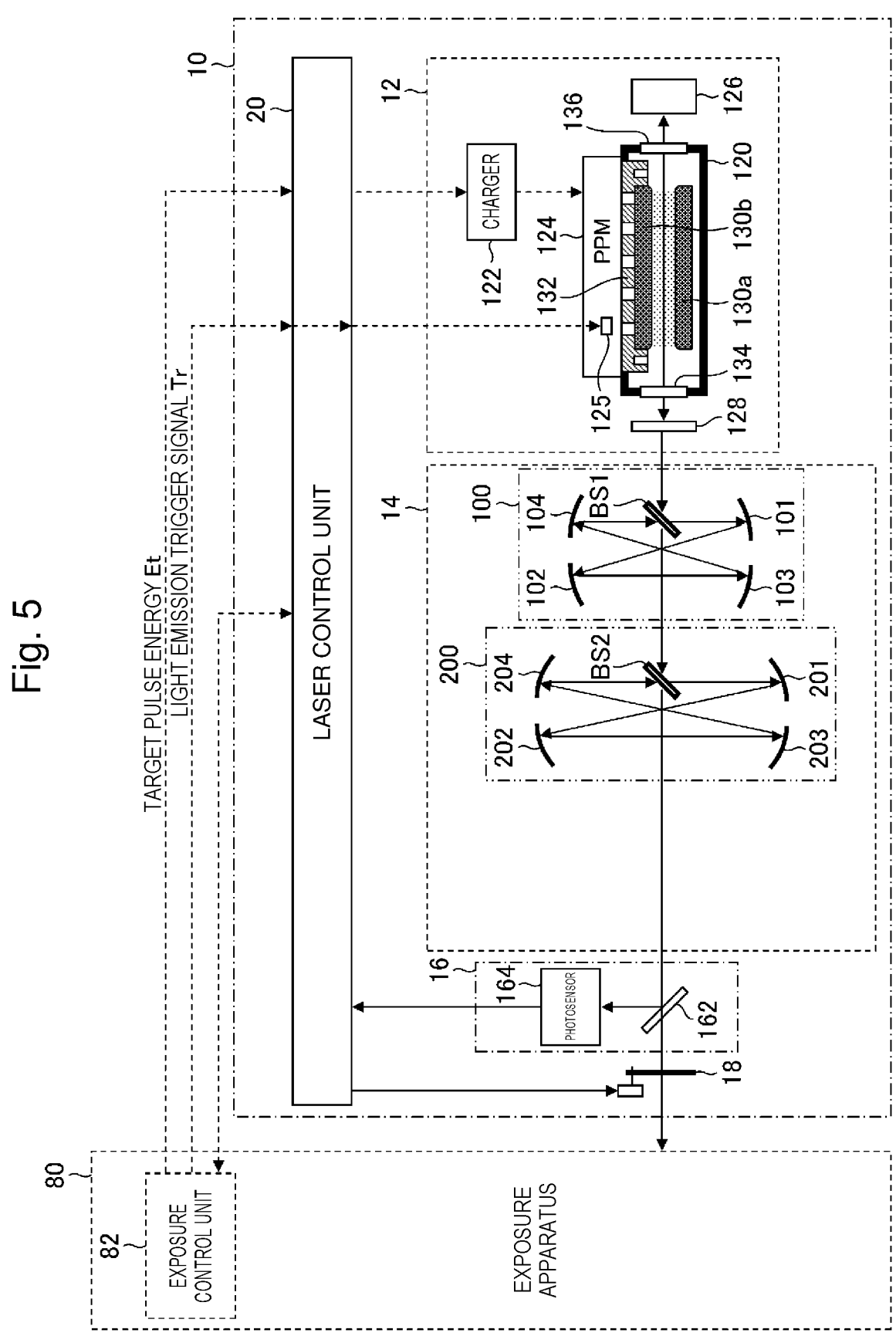
FIG. 5 schematically illustrates an exemplary configuration of an excimer laser apparatus according to a comparative example.

2. Overview of Laser Apparatus According to Comparative Example 2.1 Configuration FIG. 5 schematically illustrates an exemplary configuration of an excimer laser apparatus 10 according to a comparative example. The comparative example of the present disclosure is an example that the applicant recognizes as known only by the applicant, but is not a publicly known example that is recognized by the applicant.

The excimer laser apparatus 10 includes an oscillator 12, an optical pulse stretcher (OPS) system 14, a monitor module 16, a shutter 18, and a laser control unit 20. The OPS system 14 includes a first OPS 100 and a second OPS 200. The first OPS 100, the second OPS 200, the monitor module 16, and the shutter 18 are disposed in the stated order on the optical path of a pulse laser beam output from the oscillator 12.

When L1 represents the optical path length of a delay optical path of the first OPS 100 and L2 represents the optical path length of a delay optical path of the second OPS 200, the optical path length L2 of the delay optical path of the second OPS 200 is set to be an integral multiple of L1 by an integer equal to or larger than two. For example, the optical path length L2 is set to be twice L1.

The oscillator 12 includes a chamber 120, a charger 122, a pulse power module (PPM) 124, a line narrowing device 126, and an output coupling mirror 128.

The line narrowing device 126 includes a non-illustrated prism beam expander and a non-illustrated grating. The prism beam expander and the grating are disposed in Littrow arrangement such that the incident angle and the diffracting angle are equal to each other.

The output coupling mirror 128 is a reflection mirror having a reflectance of 40% to 60%. The output coupling mirror 128 and the line narrowing device 126 constitute an optical resonator. The chamber 120 is disposed on the optical path of the optical resonator.

The chamber 120 includes a pair of electrodes 130a and 130b, an insulating member 132, a front window 134, and a rear window 136. Laser gas of ArF, KrF, XeCl, or XeF is housed in the chamber 120.

The electrode 130a is connected to a high-voltage output terminal of the PPM 124 through the insulating member 132. The electrode 130b is connected to the ground. The electrode 130a and the electrode 130b are disposed at a predetermined gap interval from each other. The electrodes 130a and 130b are discharge electrodes, and a space between the electrodes 130a and 130b is a discharge space (discharge region).

The front window 134 and the rear window 136 are disposed such that a laser beam generated in the discharge space transmits therethrough.

The PPM 124 includes a switch 125 and a non-illustrated charge capacitor. The switch 125 is connected to a signal line through which an ON signal for the switch 125 from the laser control unit 20 is transmitted.

The charger 122 is connected to the charge capacitor of the PPM 124. The charger 122 receives data of charging voltage from the laser control unit 20 and charges the charge capacitor of the PPM 124.

The first OPS 100 includes a beam splitter BS1 and four concave mirrors 101 to 104. The beam splitter BS1 is disposed on the optical path of a pulse laser beam output from the oscillator 12. The beam splitter BS1 is coated with a film that reflects part of an incident pulse laser beam and transmits the other part. The reflectance of the beam splitter BS1 is preferably 40% to 70%, more preferably 60% approximately.

The concave mirrors 101 to 104 constitute a delay optical path of a pulse laser beam reflected by a first surface of the beam splitter BS1. The concave mirrors 101 to 104 substantially have the same focal length f1.

The concave mirrors 101 and 102 are disposed such that the pulse laser beam reflected by the first surface of the beam splitter BS1 is reflected by the concave mirror 101 and incident on the concave mirror 102. The concave mirrors 103 and 104 are disposed such that the pulse laser beam reflected by the concave mirror 102 is reflected by the concave mirror 103 and incident on the concave mirror 104. The concave mirror 104 is disposed such that the pulse laser beam reflected by the concave mirror 104 is incident on a second surface of the beam splitter BS1 opposite to the first surface.

The concave mirrors 101 and 102 are disposed such that the pulse laser beam reflected by the first surface of the beam splitter BS1 forms a first image that is an inverted image of an image on the first surface of the beam splitter BS1. The concave mirrors 103 and 104 are disposed such that the first image is returned to the beam splitter BS1 and formed as a second image that is a non-inverted image on the second surface of the beam splitter BS1. In this case, the optical path length L1 of the delay optical path of the first OPS 100 is expressed as follows: L1=8×f1. The optical path length L1 is a one-cycle delay optical path length of the delay optical path of the first OPS 100. The optical path length L1 of the first OPS 100 is, for example, 7 m.

The beam splitter BS1 is disposed such that a pulse laser beam not reflected but transmitted by the first surface of the beam splitter BS1 is incident on the second OPS 200.

The second OPS 200 is disposed on the optical path of the pulse laser beam output from the first OPS 100. The second OPS 200 includes a beam splitter BS2 and concave mirrors 201 to 204. The beam splitter BS2 may have the same configuration as the beam splitter BS1. The concave mirrors 201 to 204 substantially have the same focal length f2. The focal length f2 is longer than the focal length f1.

The beam splitter BS2 and the concave mirrors 201 to 204 in the second OPS 200 are disposed in the same disposition relation as the beam splitter BS1 and the concave mirrors 101 to 104 in the first OPS 100. In this case, the optical path length L2 of the delay optical path of the second OPS 200 is expressed as follows: L2=8×f2. The optical path length L2 is a one-cycle delay optical path length of the delay optical path of the second OPS 200. The optical path length L2 of the second OPS 200 is, for example, 14 m.

The monitor module 16 is disposed on the optical path of a pulse laser beam output from the OPS system 14. The monitor module 16 includes a beam splitter 162 and a photosensor 164. The photosensor 164 is connected to the laser control unit 20, and detection data of the photosensor 164 is transmitted to the laser control unit 20. The shutter 18 is disposed on the optical path of the pulse laser beam having transmitted through the monitor module 16. The shutter 18 is connected to the laser control unit 20 through a signal line through which a shutter opening-closing signal is transmitted.

The pulse laser beam output from the excimer laser apparatus 10 is input to an exposure apparatus 80. The laser control unit 20 is connected to an exposure control unit 82 of the exposure apparatus 80. Signal lines between the laser control unit 20 and the exposure control unit 82 include a signal line for a light emission trigger signal Tr, a signal line for data of a target pulse energy Et, and a signal line for transferring any other signal. Note that a non-illustrated amplifier including a laser chamber may be disposed between the oscillator 12 and the OPS system 14.

2.2 Operation

When having received the target pulse energy Et and an oscillation preparation signal from the exposure control unit 82, the laser control unit 20 outputs a signal for closing the shutter 18 and closes an emission port of the excimer laser apparatus 10. When the laser control unit 20 turns on the switch 125 of the PPM 124 in synchronization with the light emission trigger signal Tr at a predetermined repetition frequency, high voltage is applied between the electrodes 130a and 130b of the oscillator 12.

When insulation breakdown occurs between the electrodes 130a and 130b, discharge occurs between the electrodes 130a and 130b and laser gas is excited. As a result, laser oscillation occurs at the optical resonator constituted by the line narrowing device 126 and the output coupling mirror 128, and a line-narrowed pulse laser beam is output from the output coupling mirror 128.

The pulse laser beam output from the output coupling mirror 128 is incident on the OPS system 14. The pulse laser beam incident on the OPS system 14 is incident on the first surface of the beam splitter BS1 of the first OPS 100. Part of the pulse laser beam incident on the first surface of the beam splitter BS1 transmits through the beam splitter BS1 and is output from the first OPS 100 as a pulse laser beam of zero-cycle light not having circulated through the delay optical path.

Part of the pulse laser beam incident on the first surface of the beam splitter BS1, the part being reflected by the first surface enters the delay optical path of the first OPS 100 and is reflected by the concave mirrors 101 and 102. An optical image of the pulse laser beam reflected by the first surface of the beam splitter BS1 is formed as a first transfer image by the concave mirrors 101 and 102. Then, the first transfer image is formed as a second transfer image on the second surface of the beam splitter BS1 by the concave mirrors 103 and 104.

Part of the pulse laser beam incident on the second surface of the beam splitter BS1 from the concave mirror 104 is reflected by the second surface of the beam splitter BS1 and output from the first OPS 100 as a pulse laser beam of one-cycle light having circulated once through the delay optical path of the first OPS 100. The pulse laser beam of one-cycle light is output with a delay from the pulse laser beam of zero-cycle light by a delay time Δt1. The delay time Δt1 can be expressed as L1/c where c represents the speed of light.

Part of the pulse laser beam incident as the second transfer image on the second surface of the beam splitter BS1, the part having transmitted through the beam splitter BS1 then enters the delay optical path of the first OPS 100 and is reflected by the concave mirrors 101 to 104 and incident on the second surface of the beam splitter BS1 again. Then, the pulse laser beam reflected by the second surface of the beam splitter BS1 is output from the first OPS 100 as a pulse laser beam of two-cycle light having circulated twice through the delay optical path. The pulse laser beam of two-cycle light is output with a delay from the pulse laser beam of one-cycle light by the delay time Δt1.

Thereafter, as light circulation through the delay optical path is repeated, pulse laser beams of three-cycle light, four-cycle light, five-cycle light, . . . are output from the first OPS 100. The light intensity of pulse light output from the first OPS 100 decreases as the number of times of circulation through the delay optical path increases.

A pulse laser beam having circulated through the delay optical path of the first OPS 100 is synthesized and output with a delay from the pulse laser beam of zero-cycle light by an integral multiple of the delay time Δt1, and accordingly, the pulse waveform of the pulse laser beam of each cycle light is superimposed. As a result, the pulse width is stretched.

Similarly, the pulse width of a pulse laser beam output from the first OPS 100 is stretched by the second OPS 200.

In this manner, the pulse width of a pulse laser beam output from the output coupling mirror 128 of the oscillator 12 is stretched as the pulse laser beam passes through the delay optical paths of the first OPS 100 and the second OPS 200 a plurality of times.

Part of the pulse laser beam having passed through the first OPS 100 and the second OPS 200 is reflected by the beam splitter 162 and incident on the photosensor 164. The photosensor 164 measures pulse energy E of the incident pulse laser beam. Data indicating a result of the measurement is transmitted from the photosensor 164 to the laser control unit 20.

The laser control unit 20 sets the charger 122 so that a difference ΔE between the target pulse energy Et and the measured pulse energy E approaches zero.

When ΔE has entered an allowable range, the laser control unit 20 transmits an oscillation preparation completion signal to the exposure control unit 82 and opens the shutter 18. When the laser control unit 20 turns on the switch 125 of the PPM 124 in synchronization with the light emission trigger signal Tr from the exposure control unit 82, a pulse laser beam is output from the oscillator 12 and the pulse laser beam subjected to pulse stretching at the OPS system 14 and having pulse energy close to the target pulse energy Et is output from the excimer laser apparatus 10.

The pulse laser beam output from the excimer laser apparatus 10 is incident on the exposure apparatus 80, and a non-illustrated resist such as a semiconductor wafer is irradiated with the pulse laser beam.

2.3 Problem

The speckle contrast is correlated with the pulse width and the coherent length of a pulse laser beam such that, as the pulse width of the pulse laser beam is stretched, the coherence decreases and the speckle contrast decreases. It has been needed to add an OPS on the optical path so that the pulse width is stretched to reduce the speckle contrast. An example in which the pulse width is largely stretched has been known as Patent Document 1 (U.S. Pat. No. 5,309, 456). An example in which OPSs are connected at three stages or more on the optical path has been known as Patent Document 2 (U.S. Pat. No. 6,238,063).

However, a condition on an optimum combination of the optical path lengths of delay optical paths when OPSs are disposed at three stages or more in series on the optical path has not been known.

Figure 6:
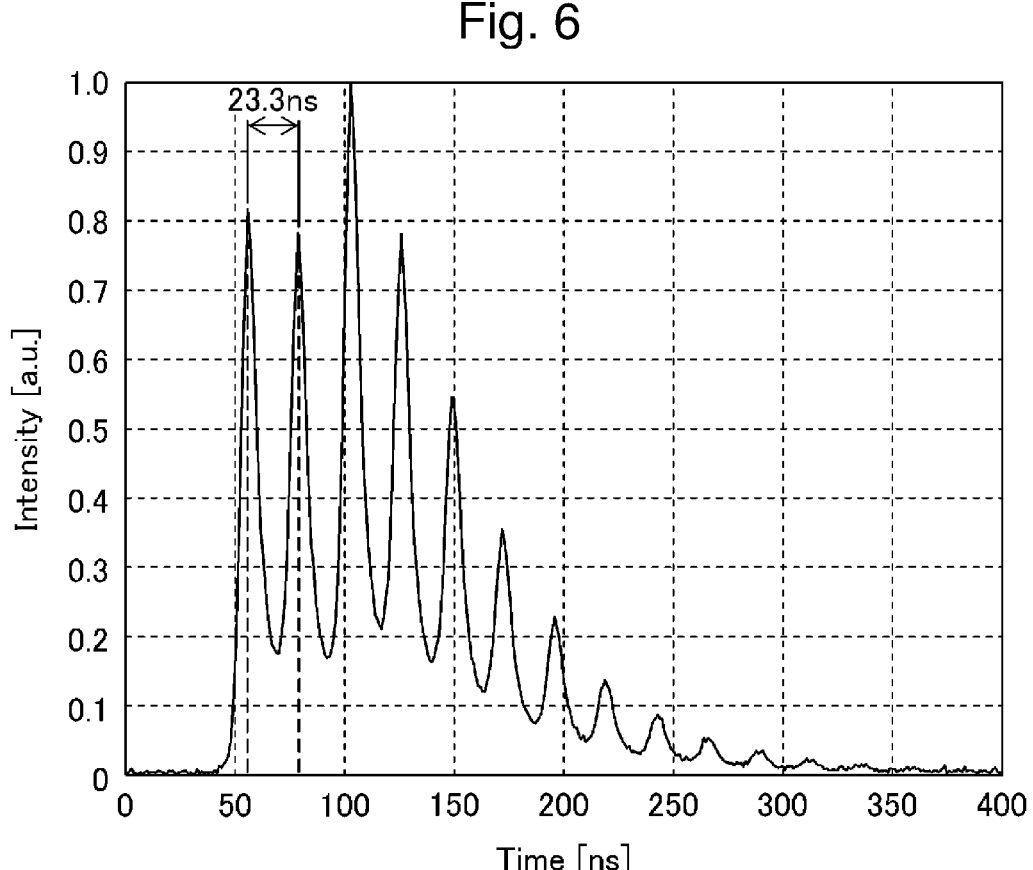
FIG. 6 exemplarily illustrates the pulse waveform of a pulse laser beam output from the excimer laser apparatus according to the comparative example.

FIG. 6 exemplarily illustrates the pulse waveform of a pulse laser beam output from the excimer laser apparatus 10 according to the comparative example. FIG. 6 indicates an example in which the optical path length L1 of the first OPS 100 is 7 m and the optical path length L2 of the second OPS 200 is 14 m. A delay time in one circulation through the delay optical path of 7 m is 23.3 ns approximately. The optical path length L2 of the second OPS 200 is set to be an integral multiple of L1, specifically, an integral multiple of L1 by an integer equal to or larger than two such that peaks of the pulse waveform overlap peaks of the first OPS 100.

In such a configuration of the excimer laser apparatus 10 including the OPS system 14, when another OPS is added to the OPS system 14 to further stretch the pulse width, it is desired to efficiently stretch the pulse width by adding a relatively short delay optical path length.

3. Embodiment 1

3.1 Configuration

Figure 7:
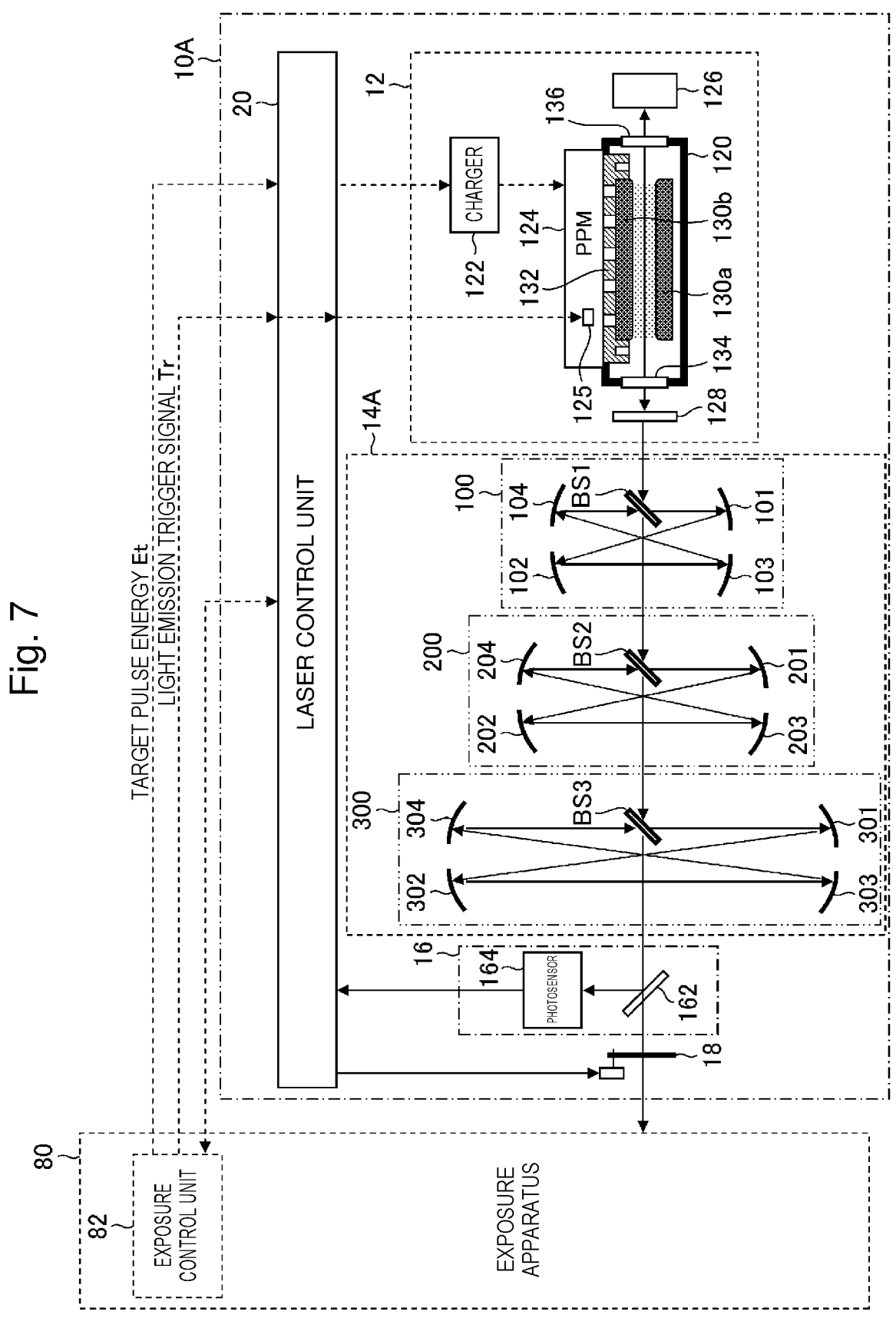
FIG. 7 schematically illustrates the configuration of an excimer laser apparatus according to Embodiment 1.

FIG. 7 schematically illustrates the configuration of an excimer laser apparatus 10A according to Embodiment 1. Description will be made on any difference of the excimer laser apparatus 10A illustrated in FIG. 7 from the configuration illustrated in FIG. 5. In the excimer laser apparatus 10A according to Embodiment 1, an OPS system 14A including a third OPS 300 is provided in place of the OPS system 14 illustrated in FIG. 5.

The configuration of the first OPS 100 and the second OPS 200 is the same as the configuration illustrated in FIG. 5. The third OPS 300 is disposed on an optical path between the second OPS 200 and the monitor module 16. In other words, the first OPS 100, the second OPS 200, and the third OPS 300 are disposed in series on the optical path of a pulse laser beam.

The excimer laser apparatus 10A is an example of a "laser apparatus" in the present disclosure. The oscillator 12 is an example of a "laser oscillator" in the present disclosure. The OPS system 14A is an example of a "pulse width stretching apparatus" in the present disclosure. The first OPS 100 is an example of a "first optical pulse stretcher" in the present disclosure. The second OPS 200 is an example of a "second optical pulse stretcher" in the present disclosure. The third OPS 300 is an example of a "third optical pulse stretcher" in the present disclosure.

The third OPS 300 includes a beam splitter BS3 and concave mirrors 301 to 304. The beam splitter BS3 is disposed on the optical path of a pulse laser beam and coated with a film that reflects part of the pulse laser beam and transmits other part thereof. The reflectance of the beam splitter BS3 is preferably 60% approximately.

The concave mirrors 301 to 304 substantially have the same focal length f3. The focal length f3 is longer than the focal length f1. The beam splitter BS3 and the concave mirrors 301 to 304 are disposed in the same disposition relation as the beam splitter BS1 and the concave mirrors 101 to 104 in the first OPS 100. In this case, an optical path length L3 of a delay optical path of the third OPS 300 is expressed as follows: L3=8×f3. The optical path length L3 is a one-cycle delay optical path length of the delay optical path of the third OPS 300.

In the configuration including the first OPS 100, the second OPS 200, and the third OPS 300 at three stages, the optical path length L3 of the added third OPS is set to be a value shifted from an integral multiple of the optical path length L1 of the first OPS 100, which is shortest among the OPSs 100, 200, and 300. Specifically, when L1 represents the optical path length of the first OPS 100, the optical path length L3 of the delay optical path of the third OPS 300 is set to satisfy a condition expressed by Expression (5) below.

[Condition 1]

$$(n-0.75)\times L1 \le L3 \le (n-0.25)\times L1 \tag{5}$$

In Expression (5), n represents an integer equal to or larger than two. For example, n may be five.

The optical path length L3 more desirably satisfies Expression (6).

$$(n-0.65)\times L1 \le L3 \le (n-0.35)\times L1 \tag{6}$$

3.2 Operation

The following describes an example in which the optical path length of the OPS system 14A is set to satisfy Condition 1. As described above, when the optical path length L1 of the first OPS 100 is 7 m, the delay time in one circulation through the first OPS 100 is 23.3 ns approximately. The reason why the optical path length L1 of the first OPS 100 is set to be 7 m is as follows. Specifically, the pulse width of a pulse laser beam output from the oscillator 12 is 40 ns approximately. The optical path length L1 is set such that the delay time in one circulation through the first OPS 100 is 23.3 ns, which is about half of 40 ns, in order to efficiently stretch the pulse width of the pulse laser beam through a single OPS having a shortest optical path length as possible.

The optical path length L2 of the second OPS is set such that peaks of the pulse waveform of a pulse through the delay optical path of the second OPS 200 overlap peaks of a pulse waveform output from the first OPS 100. Specifically, L2 is set to be an integral multiple of L1 by an integer equal to or larger than two. The description of "integral multiple" is not rigorously limited to an integral multiple but may be substantially an integral multiple and include, for example, an allowable range of ±0.25 about an integer.

The optical path length L2 of the second OPS 200 is, for example, 12.25 m to 15.75 m (40.8 ns to 52.4 ns) such that a delay time in one circulation through the delay optical path of the second OPS 200 is substantially 46.6 (=23.3×2) ns.

The optical path length L3 of the delay optical path of the third OPS is set such that peaks of the pulse waveform fill troughs between peaks of the first OPS. Specifically, L3 is set to be a multiple of L1 by the sum of "an integer equal to or larger than two and 0.5". The description of "0.5" is not rigorously limited to 0.5 but may be substantially 0.5 and include, for example, an allowable range of ±0.25 about 0.5. The optical path length L3 of the third OPS 300 is set to be, for example, 29.75 m to 33.25 m (99.0 ns to 110.7 ns) such that a delay time in one circulation through the third OPS 300 is substantially 104.9 (=23.3×4.5) ns.

Figures 8, 9:
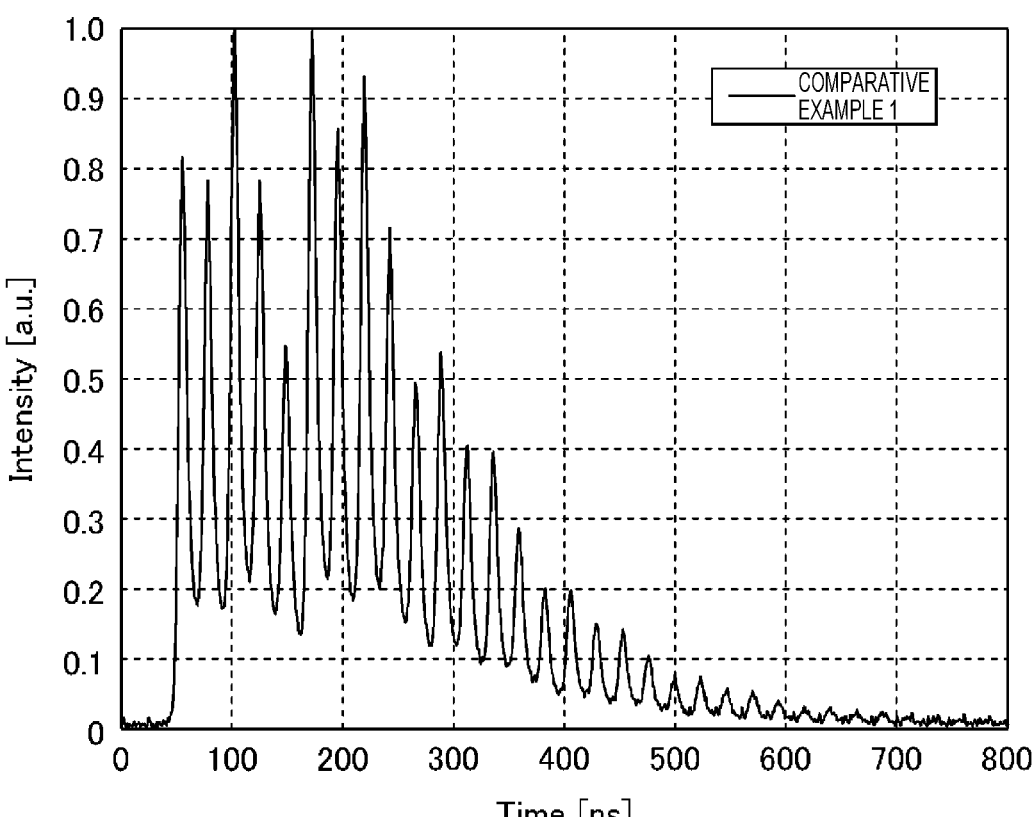
FIG. 8 is a table indicating a setting example of optical path lengths L1, L2, and L3 of a first OPS, a second OPS, and a third OPS, respectively.
FIG. 9 illustrates a pulse waveform obtained when an OPS system according to Comparative Example 1 illustrated in FIG. 8 is used.

FIG. 8 is a table indicating a setting example of the optical path lengths L1, L2, and L3 of the first OPS 100, the second OPS 200, and the third OPS 300, respectively. The example lists the pulse width (TIS width) achieved when setting of the optical path length L3 is changed while the optical path length L1 and the optical path length L2 are fixed to 7 m and 14 m, respectively.

In FIG. 8, "Comparative Example 1" corresponds to a case in which L3 is set to be an integral multiple of (in this example, five times larger than) L1. In Comparative Example 1, the pulse width is 298.1 ns and TIS/(L2+L3) is 6.08. The value of TIS/(L2+L3) indicates an increase ratio of the pulse width relative to an increased amount of the optical path length of the delay optical path and is an indicator of OPS efficiency. A larger value of TIS/(L2+L3) indicates more efficient stretching of the pulse width.

Examples A to E are examples in which the optical path length L3 is set based on Condition 1 of Expression (5). In Example A, L3 is 33.25 (=5×L1−0.25×L1) m. Example A achieves a larger pulse width with a shorter optical path length than Comparative Example 1.

In Example B, L3 is 32.55 (=5×L1−0.35×L1) m. Example B corresponds to a configuration more preferable than that of Example A and achieves a further larger pulse width with a further shorter optical path length than Example A.

Figure 10:
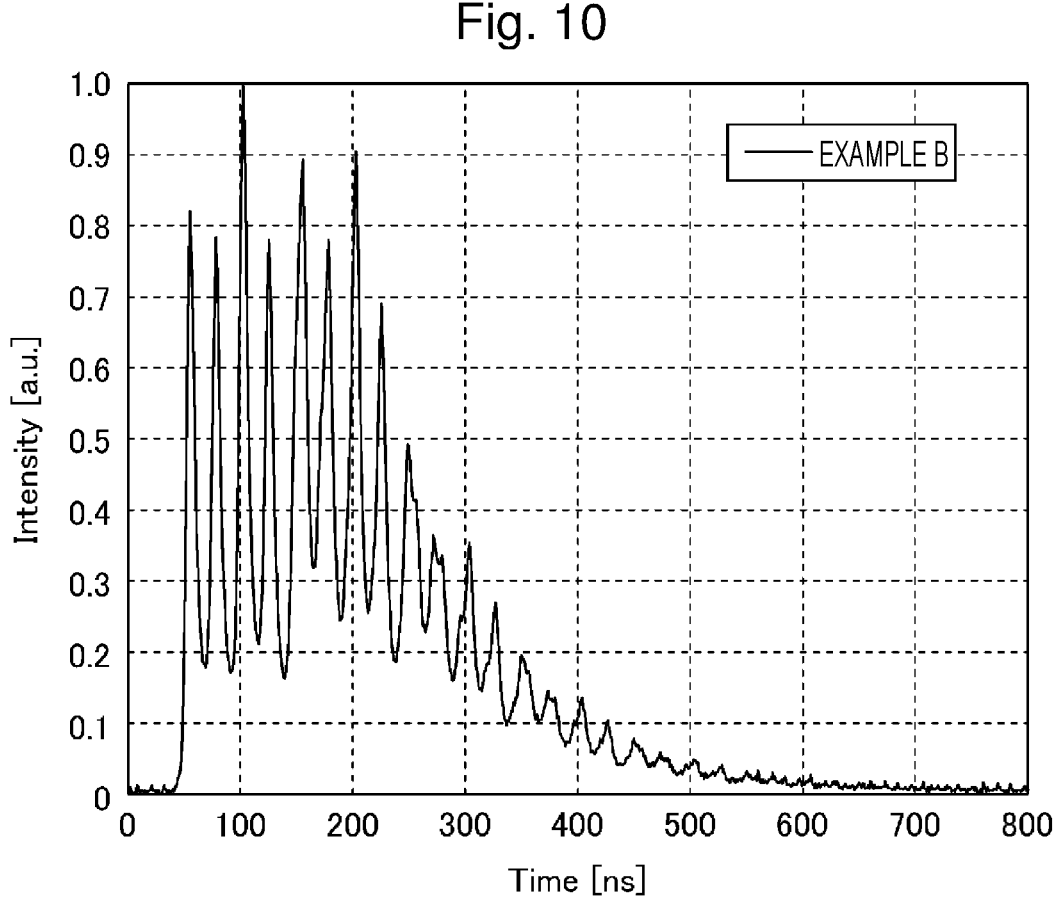
FIG. 10 illustrates a pulse waveform obtained when an OPS system according to Example B illustrated in FIG. 8 is used.

FIG. 9 illustrates a pulse waveform obtained when an OPS system according to Comparative Example 1 is used. FIG. 10 illustrates a pulse waveform obtained when the OPS system 14A according to Example B is used. As understood from these drawings, in Example B, the difference between pulse peaks and troughs is smaller than in Comparative Example 1, and thus the pulse width is efficiently stretched with a shorter optical path length than in Comparative Example 1.

Among Examples A to E listed in the table in FIG. 8, TIS/(L2+L3) is largest in Example D. In Example D, the pulse width and TIS/(L2+L3) are larger than in Comparative Example 1.

In Example E, the pulse width is slightly smaller but TIS/(L2+L3) is larger than in Comparative Example 1, and thus the pulse width is efficiently stretched.

The optical path length L3 can be expressed, by using an integer n equal to or larger than two and an optical path length coefficient k, as follows:

$$L3=n\times L1-k\times L1=(n-k)\times L1$$

where k is equal to 0 or more and less than 1. Comparative Example 1 corresponds to a case where k is 0, and Example B corresponds to a case where k is 0.35.

Figure 11:
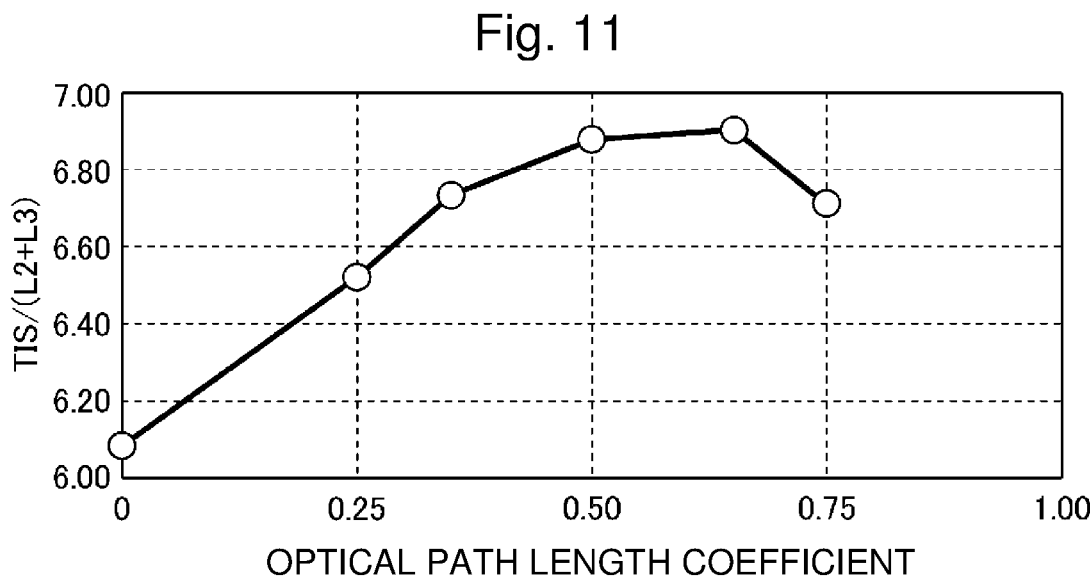
FIG. 11 is a graph illustrating change of TIS/(L2+L3) with an optical path length coefficient.

FIG. 11 is a graph illustrating change of TIS/(L2+L3) with the optical path length coefficient. The horizontal axis represents the optical path length coefficient, and the vertical axis represents TIS/(L2+L3). FIG. 11 plots the optical path length coefficient and TIS/(L2+L3) in each of Comparative Example 1 and Examples A to E. As understood from FIG. 11, the optical path length coefficient k is preferably equal to 0.25 or more and equal to 0.75 or less, more preferably equal to 0.35 or more and equal to 0.65 or less, to efficiently stretch the pulse width with a shortest optical path length as possible. In particular, the optical path length coefficient k preferably equal to 0.5 or more and equal to 0.65 or less.

3.3 Effect

With the OPS system 14A according to Embodiment 1, the pulse width can be efficiently stretched with a relatively short optical path length. With the excimer laser apparatus 10A including the OPS system 14A, TIS/(L2+L3) is larger than with a configuration including the OPS system according to Comparative Example 1.

With the excimer laser apparatus 10A, it is possible to generate a laser beam having a stretched pulse width, thereby reducing speckles.

3.4 Other

The first OPS 100, the second OPS 200, and the third OPS 300 on the optical path of a pulse laser beam is not limited to the arrangement order in the example illustrated in FIG. 7 but may be interchanged as appropriate. An equivalent pulse width is achieved irrespective of the disposition order of the first OPS 100, the second OPS 200, and the third OPS 300 on the optical path as long as combination of the values of the optical path lengths L1, L2, and L3 is the same.

Although FIG. 7 illustrates the example in which a delay optical path is formed by using four concave mirrors in each of the first OPS 100, the second OPS 200, and the third OPS 300, the configuration of the OPSs is not limited to the example. Each OPS may have a configuration including five concave mirrors or more or may have, for example, a configuration including six concave mirrors or more. Moreover, each OPS may include a mirror different from a concave mirror.

4. Embodiment 2

4.1 Configuration

Figure 12:
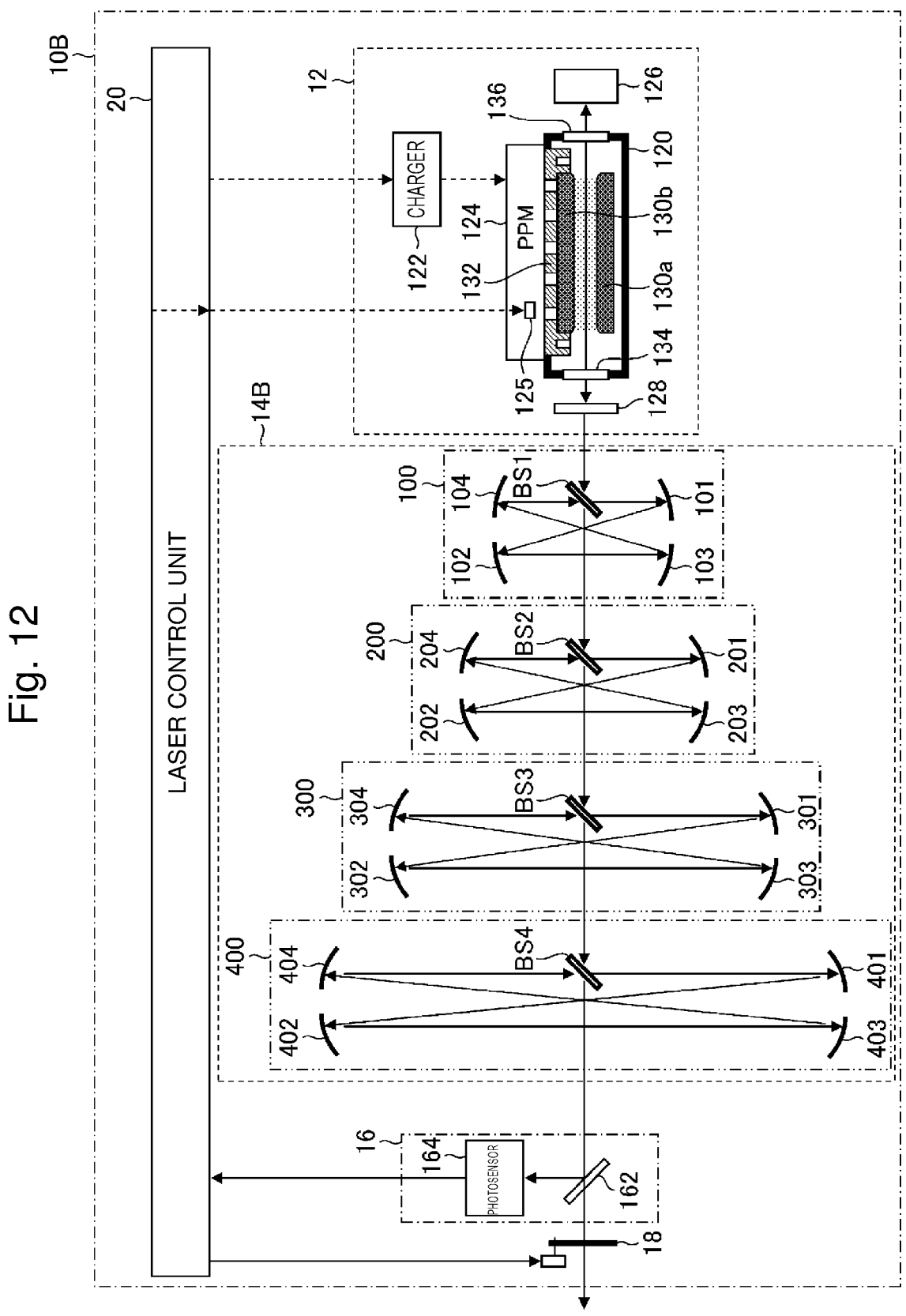
FIG. 12 schematically illustrates the configuration of an excimer laser apparatus according to Embodiment 2.

FIG. 12 schematically illustrates the configuration of an excimer laser apparatus 10B according to Embodiment 2. Description will be made on any difference of the configuration illustrated in FIG. 12 from the excimer laser apparatus 10A illustrated in FIG. 7. In the excimer laser apparatus 10B illustrated in FIG. 12, an OPS system 14B including a fourth OPS 400 is provided in place of the OPS system 14A in FIG. 7. The first OPS 100, the second OPS 200, the third OPS 300, and the fourth OPS 400 are disposed in series on the optical path of a pulse laser beam. The other configuration may be the same as the configuration in FIG. 7. The excimer laser apparatus 10B is an example of the "laser apparatus" in the present disclosure. The OPS system 14B is an example of the "pulse width stretching apparatus" in the present disclosure. The fourth OPS 400 is an example of a "fourth optical pulse stretcher" in the present disclosure.

The fourth OPS 400 is disposed on an optical path between the third OPS 300 and the monitor module 16. The fourth OPS 400 includes a beam splitter BS4 and concave mirrors 401 to 404.

The beam splitter BS4 may have the same configuration as the beam splitter BS1. The concave mirrors 401 to 404 substantially have the same focal length f4. The focal length f4 is longer than the focal length f1.

The beam splitter BS4 and the concave mirrors 401 to 404 in the fourth OPS 400 are disposed in the same disposition relation as the beam splitter BS1 and the concave mirrors 101 to 104 in the first OPS 100. In this case, an optical path length L4 of a delay optical path of the fourth OPS 400 is expressed as follows: L4=8×f4. The optical path length L4 is a one-cycle delay optical path length of the delay optical path of the fourth OPS 400.

In the configuration including the first OPS 100, the second OPS 200, the third OPS 300, and the fourth OPS 400 at four stages, the optical path length L3 of the third OPS and the optical path length L4 of the fourth OPS are set to satisfy conditions below with the optical path length L1 of the first OPS 100, which is shortest among the OPSs 100, 200, 300, and 400.

[Condition 1]

$$(n-0.75) \times L1 \le L3 \le (n-0.25) \times L1 \quad (5)$$

The optical path length L3 more desirably satisfies Expression (6) above.

[Condition 2]

$$(m-0.25) \times L1 \le L4 \le (m+0.25) \times L1 \quad (7)$$

In the expression, n and m are each an integer equal to or larger than two. The values of n and m may be equal to each other or different from each other and, for example, n may be 5 and m may be 6. The values of n and m may be determined independently from each other.

When the optical path length L3 of the third OPS 300 satisfies Condition 1, a pulse laser beam having circulated through the delay optical path of the third OPS 300 fills troughs of a pulse waveform generated through the delay optical path of the optical path length L1. When the optical path length L4 of the fourth OPS 400 satisfies Condition 2, a pulse laser beam having circulated through the delay optical path of the fourth OPS 400 overlaps peaks of a pulse waveform generated through the delay optical path of the optical path length L1.

4.2 Operation

Conditions on setting of the optical path length L1 of the first OPS 100, the optical path length L2 of the second OPS 200, and the optical path length L3 of the third OPS 300 may be the same as in Embodiment 1.

The optical path length L3 of the third OPS 300 is set such that pulse waveform peaks fill troughs between peaks of the first OPS 100, the second OPS 200, and the fourth OPS 400. For example, the optical path length L3 is set to be 29.75 [m] to 33.25 [m] (99.0 [ns] to 110.7 [ns]) such that the delay time in one circulation through the third OPS 300 is substantially 104.9 (=23.3×4.5) [ns].

The optical path length L4 of the fourth OPS 400 is set such that peaks of the pulse waveform of a pulse through the delay optical path of the fourth OPS 400 overlap peaks of a pulse waveform output from the first OPS 100. Specifically, the optical path length L4 is set to be an integral multiple of L1 by an integer equal to or larger than two. Similarly to the case of L2, the description of "integral multiple" is not rigorously limited to an integral multiple but may be substantially an integral multiple and include, for example, an allowable range of ±0.25 about an integer.

The optical path length L4 of the fourth OPS 400 is set to be, for example, 40.25 [m] to 43.75 [m] (134.0 [ns] to 145.6 [ns]) such that a delay time in one circulation through the fourth OPS 400 is substantially 139.8 (=23.3×6) [ns].

FIG. 13 is a table indicating a setting example of the optical path lengths L1, L2, L3, and L4 of the first OPS 100, the second OPS 200, the third OPS 300, and the fourth OPS 400, respectively. The example lists examples of the pulse width (TIS width) achieved when setting of the optical path length L3 and the optical path length L4 is changed while the optical path length L1 and the optical path length L2 are fixed to 7 m and 14 m, respectively.

"Comparative Example 2" in FIG. 13 corresponds to a configuration in which L3 is set to be five times larger than L1 and L4 is set to be six times larger than L1. In Comparative Example 2, the pulse width after stretching is 467.3 ns and TIS/(L3+L4) is 6.07. The value of TIS/(L3+L4) indicates an increase ratio of the pulse width relative to an increased amount of the optical path length and is an indicator of OPS efficiency. A larger value of TIS/(L3+L4) indicates more efficiently stretching of the pulse width.

Examples F to L are examples in which the optical path length L3 and the optical path length L4 are set based on Condition 1 of Expression (5) and Condition 2 of Expression (7). In Example F, L3 is 33.25 (=5×L1−0.25×L1) [m] and L4 is 42 (=6×L1) [m]. In Example F, the pulse width of 525.6 ns is achieved by the optical path increase of 75.25 (=L3+L4) m, and TIS/(L3+L4) is 6.98. Example F achieves a larger pulse width with a shorter optical path length than Comparative Example 2.

In Example G, L3 is 32.55 (=5×L1−0.35×L1) [m] and L4 is 42 (=6×L1) [m]. Example G corresponds to a configuration more preferable than that of Example F and achieves a further larger pulse width with a further shorter optical path length than Example F. Among Examples F to L exemplarily illustrated in FIG. 13, the pulse width is largest in Example G.

Figure 14:
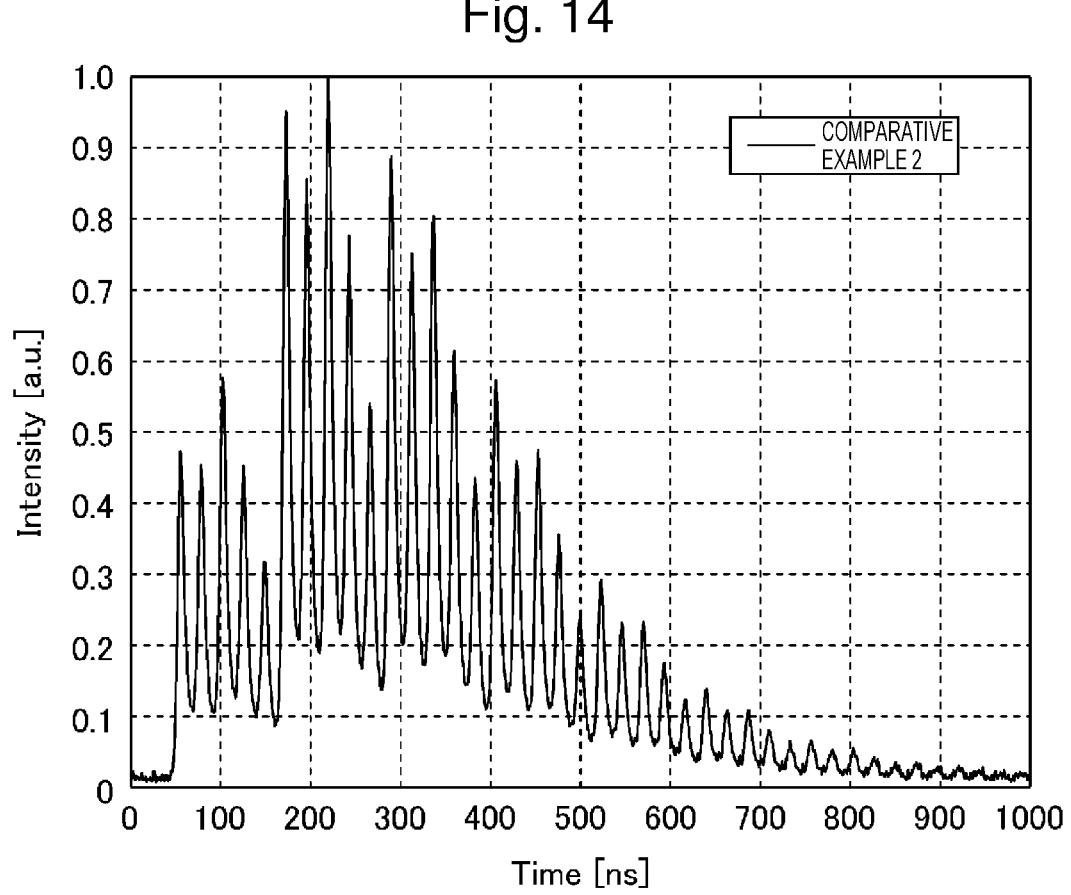
FIG. 14 illustrates a pulse waveform obtained when an OPS system according to Comparative Example 2 is used.
Figure 15:
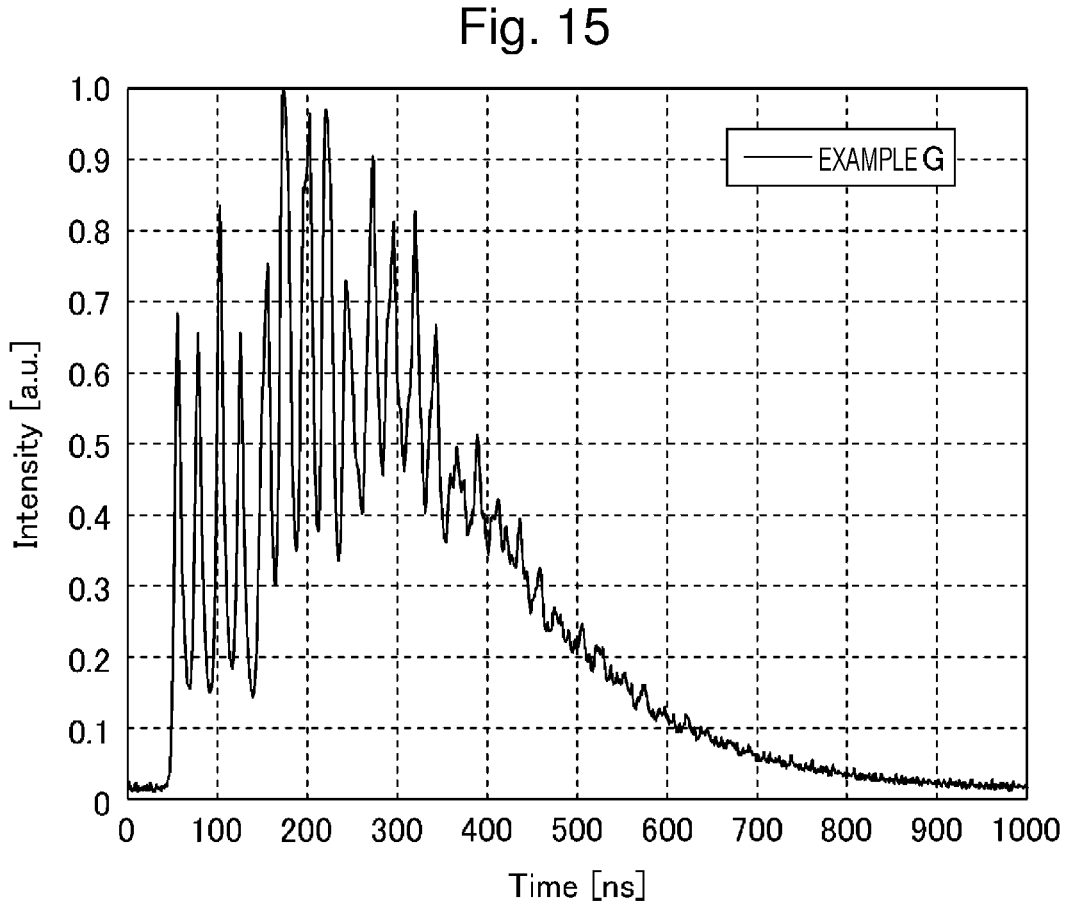
FIG. 15 illustrates a pulse waveform obtained when an OPS system according to Example G is used.

FIG. 14 illustrates a pulse waveform obtained when an OPS system according to Comparative Example 2 is used. FIG. 15 illustrates a pulse waveform obtained when the OPS system 14B according to Example G is used. As understood from these drawings, in Example G, the difference between pulse waveform peaks and troughs is smaller than in Comparative Example 2, and the pulse width is stretched with a shorter optical path length than in Comparative Example 2.

Among the examples F to L exemplarily illustrated in FIG. 13, TIS/(L3+L4) is largest in Example I. In Example I, the pulse width and TIS/(L3+L4) are larger than in Comparative Example 2. In Example I, the pulse width is smaller but TIS/(L3+L4) is larger than in Example G, and thus the pulse width is efficiently stretched.

Figure 16:
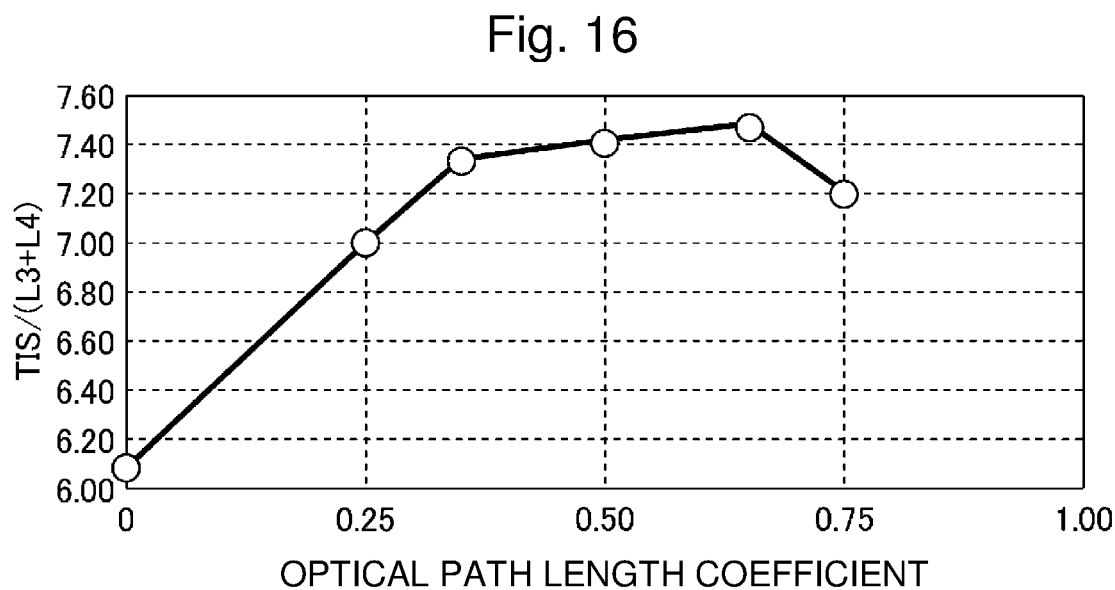
FIG. 16 is a graph illustrating change of TIS/(L3+L4) with the optical path length coefficient.

FIG. 16 is a graph illustrating change of TIS/(L3+L4) with the optical path length coefficient. The horizontal axis represents the optical path length coefficient, and the vertical axis represents TIS/(L3+L4). FIG. 16 plots the optical path length coefficient k and TIS/(L3+L4) in each of Comparative Example 2 and Examples F to J. As understood from FIG. 16, the optical path length coefficient k is preferably equal to 0.25 or more and 0.75 or less, more preferably 0.35 or more and 0.65 or less, to efficiently stretch the pulse width with a shortest optical path length as possible. In particular, the optical path length coefficient k is preferably 0.5 or more and 0.65 or less.

4.3 Effect

According to Embodiment 2, the pulse width can be efficiently stretched with a relatively short optical path length. The pulse width can be more efficiently stretched than in Embodiment 1.

4.4 Other

The first OPS 100, the second OPS 200, the third OPS 300, and the fourth OPS 400 on the optical path of a pulse laser beam are not limited to the arrangement order in the example of FIG. 12 but may be interchanged as appropriate. An equivalent pulse width is achieved irrespective of the disposition order of the first OPS 100, the second OPS 200, the third OPS 300, and the fourth OPS 400 on the optical path as long as combination of the values of the optical path lengths L1, L2, L3, and L4 is the same. Moreover, the fourth OPS 400 is not limited to the configuration exemplarily illustrated in FIG. 12 but may have a configuration including five concave mirrors or more and may include a mirror different from a concave mirror.

Figure 17:
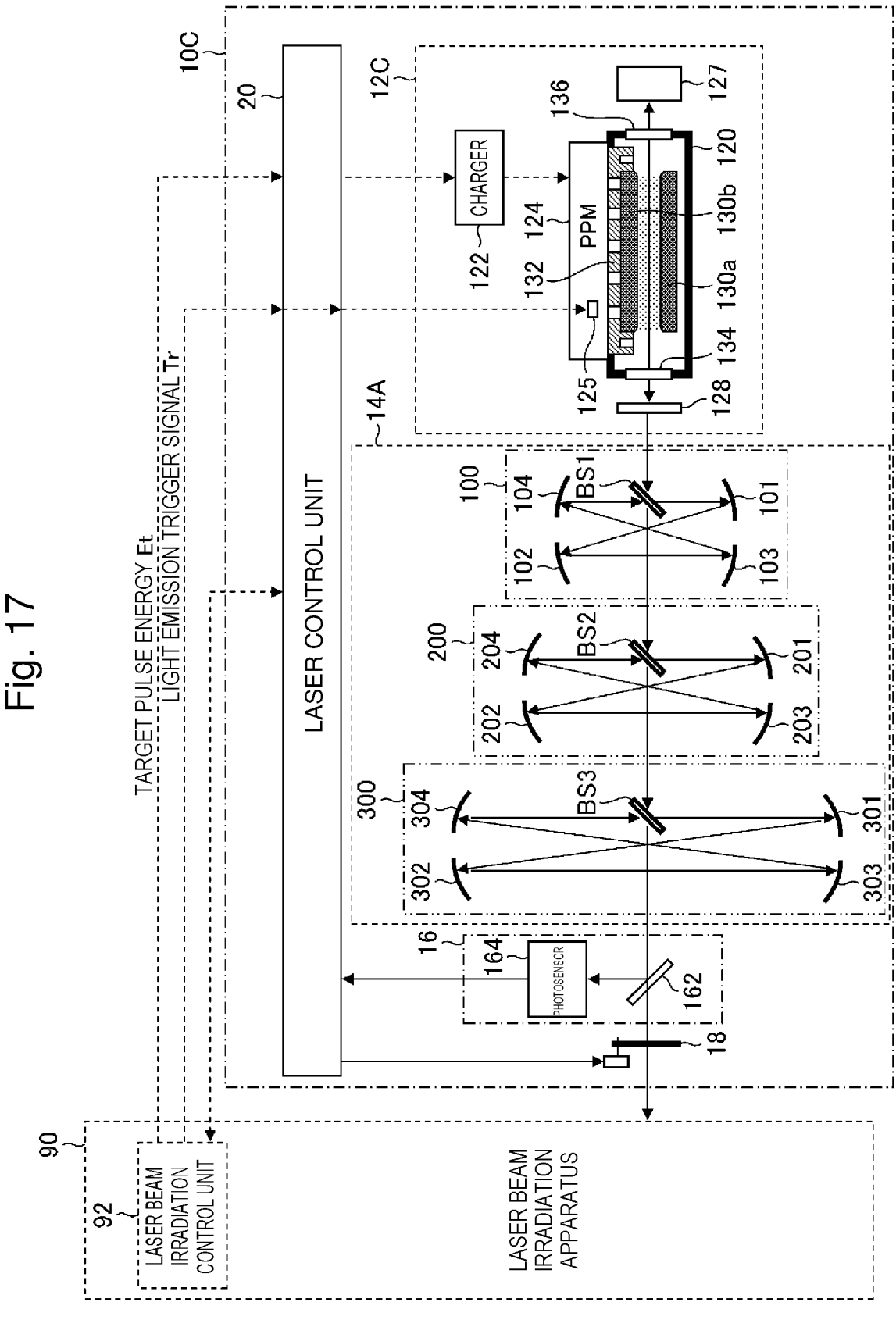
FIG. 17 schematically illustrates an exemplary configuration of a laser irradiation system to which a free-run excimer laser apparatus is applied.

5. Variations of Laser Apparatus 5.1 Free-Run Excimer Laser Apparatus
5.1.1 Configuration FIG. 17 schematically illustrates an exemplary configuration of a laser irradiation system to which a free-run excimer laser apparatus 10C is applied. Description will be made on any difference of the configuration illustrated in FIG. 17 from the configuration in FIG. 7.

Although the oscillator 12 illustrated in FIG. 7 includes the line narrowing device 126, an oscillator 12C illustrated in FIG. 17 includes a rear mirror 127 in place of the line narrowing device 126. The rear mirror 127 may be a high reflective mirror. The oscillator 12C is an example of the "laser oscillator" in the present disclosure.

The laser irradiation system illustrated in FIG. 17 includes a laser beam irradiation apparatus 90 in place of the exposure apparatus 80 in FIG. 7. The laser beam irradiation apparatus 90 may be, for example, a laser fabrication machine configured to fabricate a substrate or the like with a laser beam, or a laser annealing apparatus configured to perform polycrystallization of amorphous silicon. Alternatively, the laser beam irradiation apparatus 90 may be a laser doping apparatus configured to perform laser doping.

The laser beam irradiation apparatus 90 includes a laser beam irradiation control unit 92. The laser beam irradiation control unit 92 includes a processor and controls the laser beam irradiation apparatus 90. The laser beam irradiation control unit 92 is connected to the laser control unit 20. The laser beam irradiation control unit 92 plays a role similar to the exposure control unit 82 in FIG. 7 for the laser control unit 20.
5.1.2 Operation A pulse laser beam of a free-run spectrum waveform is output from the oscillator 12C. The pulse laser beam output from the oscillator 12C is subjected to pulse stretching at the OPS system 14A. The pulse laser beam output from the excimer laser apparatus 10C is incident on the laser beam irradiation apparatus 90.

Figure 18:
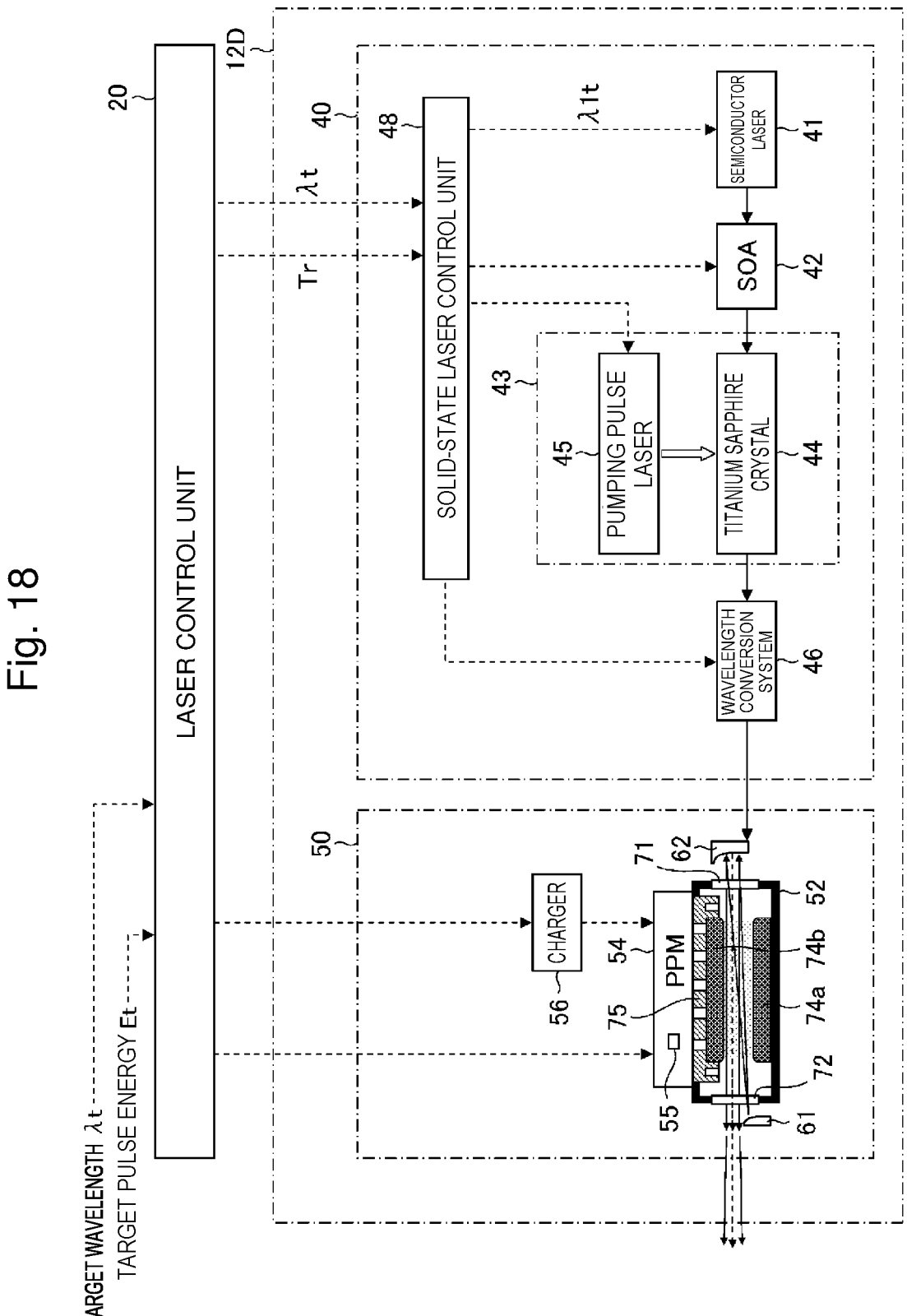
FIG. 18 schematically illustrates an exemplary configuration of an excimer laser apparatus including a variable-wavelength solid-state laser system as a master oscillator.

In the laser beam irradiation apparatus 90, material fabrication, annealing, doping, or the like is performed by irradiating a non-illustrated irradiation target object such as a substrate with the pulse laser beam. The irradiation target object may be various materials such as semiconductor, glass, and ceramic. Various electronic devices can be manufactured through a plurality of processes after the irradiation target object is irradiated with the pulse laser beam in the laser beam irradiation apparatus 90.
5.1.3 Effect Similarly to Embodiment 1, with the excimer laser apparatus 10C, the pulse width can be efficiently stretched with a relatively short optical path length, and speckles of an irradiation beam are reduced in the laser beam irradiation apparatus 90 illustrated in FIG. 17. Note that it is possible to employ a configuration in which the OPS system 14A of the excimer laser apparatus 10C illustrated in FIG. 17 is replaced with the OPS system 14B in FIG. 12.
5.2 Excimer Laser Apparatus Including Solid-State Laser System as Master Oscillator
5.2.1 Configuration FIG. 18 schematically illustrates an exemplary configuration of an excimer laser apparatus 12D including a variable-wavelength solid-state laser system as a master oscillator. The excimer laser apparatus 12D illustrated in FIG. 18 may be applied in place of the oscillator 12 described above with reference to FIGS. 7 and 12 or the oscillator 12C described above with reference to FIG. 17.

The excimer laser apparatus 12D is a master oscillator power amplifier (MOPA) laser including a solid-state laser system 40 and an excimer amplifier 50. The solid-state laser system 40 is a variable-wavelength solid-state laser system including a semiconductor laser 41 configured to emit seed light, a semiconductor optical amplifier (SOA) 42, a titanium sapphire amplifier 43 configured to amplify the seed light, a wavelength conversion system 46, and a solid-state laser control unit 48.

The semiconductor laser 41 is a distributed-feedback (DFB) semiconductor laser configured to emit a CW laser beam of a wavelength of 773.6 nm approximately. Hereinafter, the semiconductor laser 41 is referred to as a "DFB laser 41". The DFB laser 41 can vary an oscillation wavelength by controlling the temperature of a semiconductor laser element or a current value.

The SOA 42 is a semiconductor element configured to convert CW or pulse seed light into a pulse laser beam of a predetermined pulse width by causing pulse current flow through a semiconductor. The SOA 42 converts the CW laser beam output from the DFB laser 41 into pulses and outputs a pulse laser beam provided with pulse amplification.

The titanium sapphire amplifier 43 includes a titanium sapphire crystal 44 and a pumping pulse laser 45. The titanium sapphire crystal 44 is disposed on the optical path of the pulse laser beam provided with pulse amplification at the SOA 42. The pumping pulse laser 45 is, for example, a laser apparatus configured to emit second harmonic light of a YLF laser. YLF (yttrium lithium fluoride) is a solid-state laser crystal expressed by chemical formula $LiYF_4$.

The wavelength conversion system 46 is a wavelength conversion system configured to generate fourth harmonic and including non-illustrated LBO and KBBF crystals. The LBO crystal is a non-linear optical crystal expressed by chemical formula $LiB_3O_5$. The KBBF crystal is a non-linear optical crystal expressed by chemical formula $KBe_2BO_3F_2$. Each of these non-linear optical crystals is disposed on a non-illustrated rotation stage so that the incident angle on the crystal can be changed. The wavelength conversion system 46 provides a pulse laser beam of 773.6 nm with wavelength conversion and outputs a pulse laser beam of a wavelength of 193.4 nm approximately.

The excimer amplifier 50 includes a chamber 52, a PPM 54, a charger 56, a convex mirror 61, and a concave mirror 62. The chamber 52 includes windows 71 and 72, a pair of electrodes 74a and 74b, and an electrical insulating member 75. ArF laser gas is housed inside the chamber 52.

The excimer amplifier 50 performs amplification by causing seed light of a wavelength of 193.4 nm to pass through a discharge space between the electrodes 74a and 74b three times.

The convex mirror 61 and the concave mirror 62 are disposed outside the chamber 52 such that a pulse laser beam output from the solid-state laser system 40 is subjected to beam expansion through three-time passing.

Seed light having a wavelength of 193.4 nm approximately and incident on the excimer amplifier 50 is reflected by the convex mirror 61 and the concave mirror 62 and passes through the discharge space between the electrodes 74a and 74b three times. Accordingly, a beam of the seed light is enlarged and amplified.

5.2.2 Operation

When having received a target wavelength λt and a target pulse energy Et, the laser control unit 20 transmits the target wavelength λt to the solid-state laser control unit 48 and sets charging voltage to the charger 56 so that the target pulse energy Et is obtained.

Having received the target wavelength λt from the laser control unit 20, the solid-state laser control unit 48 changes a target oscillation wavelength λ1t of the DFB laser 41 so that the wavelength of a laser beam output from the wavelength conversion system 46 becomes λt. The target oscillation wavelength λ1t is four times longer than the target wavelength λt (λ1t=4λt). The solid-state laser control unit 48 changes the oscillation wavelength at high speed by controlling a current value flowing through the DFB laser 41.

In addition, the solid-state laser control unit 48 controls the rotation stages of the LBO and KBBF crystals to set incident angles with which the efficiency of wavelength conversion through the crystals in the wavelength conversion system 46 is maximized.

When having received the light emission trigger signal Tr from the laser control unit 20, the solid-state laser control unit 48 transmits signals to the SOA 42 and the pumping pulse laser 45. As a result, pulse current is input to the SOA 42, and a pulse laser beam provided with pulse amplification is output from the SOA 42. Then, further pulse amplification is provided at the titanium sapphire amplifier 43. The pulse laser beam provided with pulse amplification at the titanium sapphire amplifier 43 is incident on the wavelength conversion system 46. As a result, the pulse laser beam of the target wavelength λt is output from the wavelength conversion system 46.

When having received the light emission trigger signal Tr from the exposure control unit 82 or the laser beam irradiation control unit 92, the laser control unit 20 provides a trigger signal to each of a switch 55 of the PPM 54 and the pumping pulse laser 45 so that discharge occurs when the pulse laser beam output from the solid-state laser system 40 enters the discharge space in the chamber 52 of the excimer amplifier 50. As a result, the pulse laser beam output from the solid-state laser system 40 is amplified at the excimer amplifier 50 through three-time passing.

The pulse laser beam amplified at the excimer amplifier 50 is incident on the OPS system 14A in FIG. 7, the OPS system 14B in FIG. 12, or the OPS system 14A in FIG. 17. The excimer laser apparatus 12D is an example of the "laser oscillator" in the present disclosure.

The pulse laser beam output from the OPS system 14A or 14B is sampled by the beam splitter 162 of the monitor module 16, the pulse energy E thereof is measured by the photosensor 164, and the wavelength λ thereof is measured by a non-illustrated wavelength monitor.

The laser control unit 20 controls the charging voltage of the charger 56 and the target oscillation wavelength λ1t of the DFB laser 41 so that the difference between the measured pulse energy E and the target pulse energy Et and the difference between the measured wavelength λ and the target wavelength λt, respectively, approach zero.

The pulse laser beam having transmitted through the beam splitter 162 of the monitor module 16 is incident on the exposure apparatus 80 or the laser beam irradiation apparatus 90 through the shutter 18.

5.2.3 Modification

An embodiment of a solid-state laser system is not limited to the example in FIG. 18 but may be, for example, a solid-state laser system that includes a DFB laser configured to emit a laser beam having a wavelength of 1547.2 nm and an SOA and in which a wavelength conversion system outputs eighth harmonic light (193.4 nm light).

Although FIG. 18 illustrates an example in which the excimer amplifier 50 is a multipath amplifier, the present invention is not limited to the example and the excimer amplifier 50 may be, for example, an amplifier including a Fabry-Perot resonator or a ring resonator. Alternatively, the excimer amplifier 50 illustrated in FIG. 18 may be omitted, and in this configuration, a pulse laser beam output from the solid-state laser system 40 may be incident on the OPS system 14A or the OPS system 14B to stretch the pulse width thereof. In this case, the solid-state laser system 40 is an example of the "laser oscillator" in the present disclosure.

6. Hardware Configurations of Various Control Units

The laser control unit 20, the exposure control unit 82, the laser beam irradiation control unit 92, the solid-state laser control unit 48, and any other control unit are configured by using a processor. For example, these control units can be achieved by hardware and software combination of computers each including a processor. The software is synonymous with a computer program.

Each computer includes a central processing unit (CPU) and a storage device such as a memory. The CPU is an example of the processor. The computers conceptually include a programmable controller. The storage device is a non-transitory computer-readable medium that is a tangible object and includes, for example, a memory that is a main storage device and a storage that is an auxiliary storage device. The computer-readable medium may be, for example, a semiconductor memory, a hard disk drive (HDD) device, a solid-state drive (SSD) device, or a combination thereof. A computer program executed by the processor is stored in the computer-readable medium. The storage device may be included in the processor.

Some or all of processing functions of a computer may be implemented by using an integrated circuit such as a field programmable gate array (FPGA) or an application specific integrated circuit (ASIC).

Functions of a plurality of control units can be implemented by a single computer. Moreover, in the present disclosure, devices including a processor may be connected with each other through a communication network such as a local area network or the Internet. In a distributed computing environment, a program unit may be stored in local and remote memory storage devices.

7. Electronic Device Manufacturing Method

Figure 19:
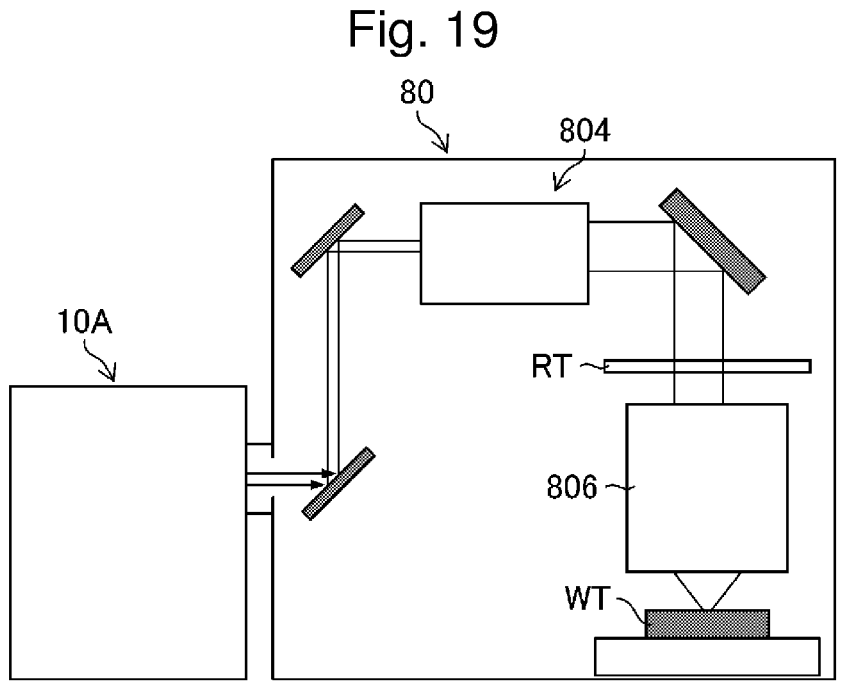
FIG. 19 schematically illustrates an exemplary configuration of an exposure apparatus.

FIG. 19 schematically illustrates an exemplary configuration of the exposure apparatus 80. The exposure apparatus 80 includes an illumination optical system 804 and a projection optical system 806. The illumination optical system 804 illuminates, with a laser beam incident from the excimer laser apparatus 10A, the reticle pattern of a non-illustrated reticle disposed on a reticle stage RT. The laser beam having transmitted through the reticle is subjected to reduced projection through the projection optical system 806 and imaged on a non-illustrated workpiece disposed on a workpiece table WT. The workpiece is a photosensitive substrate such as a semiconductor wafer to which photoresist is applied.

The exposure apparatus 80 translates the reticle stage RT and the workpiece table WT in synchronization so that the workpiece is exposed to the laser beam on which the reticle pattern is reflected. A semiconductor device can be manufactured through a plurality of processes after the reticle pattern is transferred onto the semiconductor wafer through the exposure process as described above. The semiconductor device is an example of an "electronic device" in the present disclosure. Not only the excimer laser apparatus 10A but also, for example, the excimer laser apparatuses 10B and 10C may be used.

8. Other

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims, unless otherwise stated, should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A laser apparatus comprising:
a laser oscillator configured to emit a pulse laser beam;
a first optical pulse stretcher disposed on an optical path of the pulse laser beam;
a second optical pulse stretcher disposed on the optical path of the pulse laser beam;
a third optical pulse stretcher disposed on the optical path of the pulse laser beam; and
a fourth optical pulse stretcher disposed on the optical path of the pulse laser beam,
when L1 represents an optical path length of a delay optical path of the first optical pulse stretcher, L2 represents an optical path length of a delay optical path of the second optical pulse stretcher, L3 represents an optical path length of a delay optical path of the third optical pulse stretcher, n represents an integer equal to or larger than two, L4 represents an optical path length of a delay optical path of the fourth optical pulse stretcher, and m represents an integer equal to or larger than two,
L2 being an integral multiple of L1 by an integer equal to or larger than two,
the integer equal to or larger than two including an allowable range of ±0.25,
L3 satisfying a condition expressed by $$(n-0.75) \times L1 \leq L3 \leq (n-0.25) \times L1,$$

L4 satisfying a condition expressed by $$(m-0.25) \times L1 \leq L4 \leq (m+0.25) \times L1,$$

$$m=n.$$

2. The laser apparatus according to claim 1, wherein L3 satisfies a condition expressed by $$(n-0.65) \times L1 \leq L3 \leq (n-0.35) \times L1.$$

3. The laser apparatus according to claim 1, wherein the first optical pulse stretcher, the second optical pulse stretcher, and the third optical pulse stretcher each include a beam splitter and four or more concave mirrors.

4. The laser apparatus according to claim 1, wherein the first optical pulse stretcher, the second optical pulse stretcher, and the third optical pulse stretcher are disposed in series on the optical path of the pulse laser beam.

5. The laser apparatus according to claim 1, wherein the first optical pulse stretcher, the second optical pulse stretcher, the third optical pulse stretcher, and the fourth optical pulse stretcher each include a beam splitter and four or more concave mirrors.

6. The laser apparatus according to claim 1, wherein the first optical pulse stretcher, the second optical pulse stretcher, the third optical pulse stretcher, and the fourth optical pulse stretcher are disposed in series on the optical path of the pulse laser beam.

7. The laser apparatus according to claim 1, wherein the laser oscillator is an excimer laser apparatus including a line narrowing module.

8. The laser apparatus according to claim 1, wherein the laser oscillator is a free-run excimer laser apparatus.

9. The laser apparatus according to claim 1, wherein the laser oscillator is a solid-state laser system.

10. The laser apparatus according to claim 9, wherein the solid-state laser system includes a semiconductor laser and a semiconductor optical amplifier.

11. An electronic device manufacturing method comprising:
generating a laser beam having a pulse width stretched by a laser apparatus, the laser apparatus including
a laser oscillator configured to emit a pulse laser beam,
a first optical pulse stretcher disposed on an optical path of the pulse laser beam,
a second optical pulse stretcher disposed on the optical path of the pulse laser beam,
a third optical pulse stretcher disposed on the optical path of the pulse laser beam; and
a fourth optical pulse stretcher disposed on the optical path of the pulse laser beam,
when L1 represents an optical path length of a delay optical path of the first optical pulse stretcher, L2 represents an optical path length of a delay optical path of the second optical pulse stretcher, L3 represents an optical path length of a delay optical path of the third optical pulse stretcher, n represents an integer equal to or larger than two, L4 represents an optical path length of a delay optical path of the fourth optical pulse stretcher, and m represents an integer equal to or larger than two,
L2 being an integral multiple of L1 by an integer equal to or larger than two,
the integer equal to or larger than two including an allowable range of ±0.25,
L3 satisfying a condition expressed by $$(n-0.75) \times L1 \leq L3 \leq (n-0.25) \times L1,$$

L4 satisfying a condition expressed by $$(m-0.25) \times L1 \leq L4 \leq (m+0.25) \times L1,$$

$$m=n;$$

outputting the laser beam to an exposure apparatus or a laser beam irradiation apparatus; and exposing a photosensitive substrate to the laser beam in the exposure apparatus or irradiating an irradiation target object with the laser beam in the laser beam irradiation apparatus to manufacture an electronic device.

* * * * *